(12) United States Patent
Graber

(10) Patent No.: US 7,787,319 B2
(45) Date of Patent: Aug. 31, 2010

(54) SENSE AMPLIFIER CIRCUITRY FOR INTEGRATED CIRCUIT HAVING MEMORY CELL ARRAY, AND METHOD OF OPERATING SAME

(75) Inventor: Philippe Graber, Villars-Burquin (CH)

(73) Assignee: Innovative Silicon ISi SA, Lausanne (CH)

( * ) Notice: Subject to any disclaimer, the term of this patent is extended or adjusted under 35 U.S.C. 154(b) by 211 days.

(21) Appl. No.: 12/218,895

(22) Filed: Jul. 18, 2008

(65) Prior Publication Data

US 2009/0067218 A1    Mar. 12, 2009

Related U.S. Application Data

(60) Provisional application No. 60/967,605, filed on Sep. 6, 2007.

(51) Int. Cl.
  *G11C 7/02* (2006.01)
(52) U.S. Cl. .................................. 365/207; 365/205
(58) Field of Classification Search .............. 365/207, 365/205, 203
See application file for complete search history.

(56) References Cited

U.S. PATENT DOCUMENTS

| | | | |
|---|---|---|---|
| 4,613,957 A | 9/1986 | Iwahashi | |
| 6,414,883 B2 * | 7/2002 | Hidaka et al. | 365/189.11 |
| 6,567,330 B2 | 5/2003 | Fujita et al. | |
| 6,969,662 B2 | 11/2005 | Fazan et al. | |
| 7,453,751 B2 * | 11/2008 | Forbes et al. | 365/207 |
| 7,636,264 B2 * | 12/2009 | Fort | 365/189.15 |
| 2003/0035324 A1 | 2/2003 | Fujita et al. | |
| 2006/0044903 A1 | 3/2006 | Forbes | |
| 2006/0126374 A1 | 6/2006 | Waller et al. | |
| 2006/0131650 A1 | 6/2006 | Okhonin et al. | |
| 2007/0058427 A1 | 3/2007 | Okhonin et al. | |
| 2008/0133849 A1 | 6/2008 | Deml et al. | |
| 2008/0144367 A1 | 6/2008 | Dreesen et al. | |

OTHER PUBLICATIONS

T. Ohsawa et al., "Memory Design Using a One-Transistor Gain Cell on SOI", *IEEE Journal of Solid-State Circuits 37*, No. 11, Nov. 2002: 1510-1522.

T. Ohsawa et al., "An 18.5ns 128Mb SOI DRAM with a Floating Body Cell", *IEEE International Solid-State Circuits Conference (ISSCC 2005)*, Digest of Technical Papers, Session 25 / Dynamic Memory / Paper 25.1, 2005: 458-459 and 609.

* cited by examiner

*Primary Examiner*—Anh Phung
(74) *Attorney, Agent, or Firm*—Neil A. Steinberg

(57) ABSTRACT

An integrated circuit device (e.g., a logic device or a memory device) having (i) a memory cell array which includes a plurality of memory cells (for example, memory cells having electrically floating body transistors) and (ii) sense amplifier circuitry, coupled to the memory cell array, to sense a data state stored in one of the memory cells during a sense phase of operation. In one embodiment, the sense amplifier circuitry includes first and second capacitors, a first input electrically coupled to (i) the memory cell to receive a signal which is representative of the data state stored therein and (ii) a first terminal of the first capacitor, and a second input electrically coupled to (i) a first predetermined voltage and (ii) a first terminal of the second capacitor. The sense amplifier circuitry further includes a current source and a transistor wherein the gate of the transistor is electrically coupled to the second terminals of the first and second capacitors, and a first region of the transistor is electrically coupled to the current source.

15 Claims, 28 Drawing Sheets

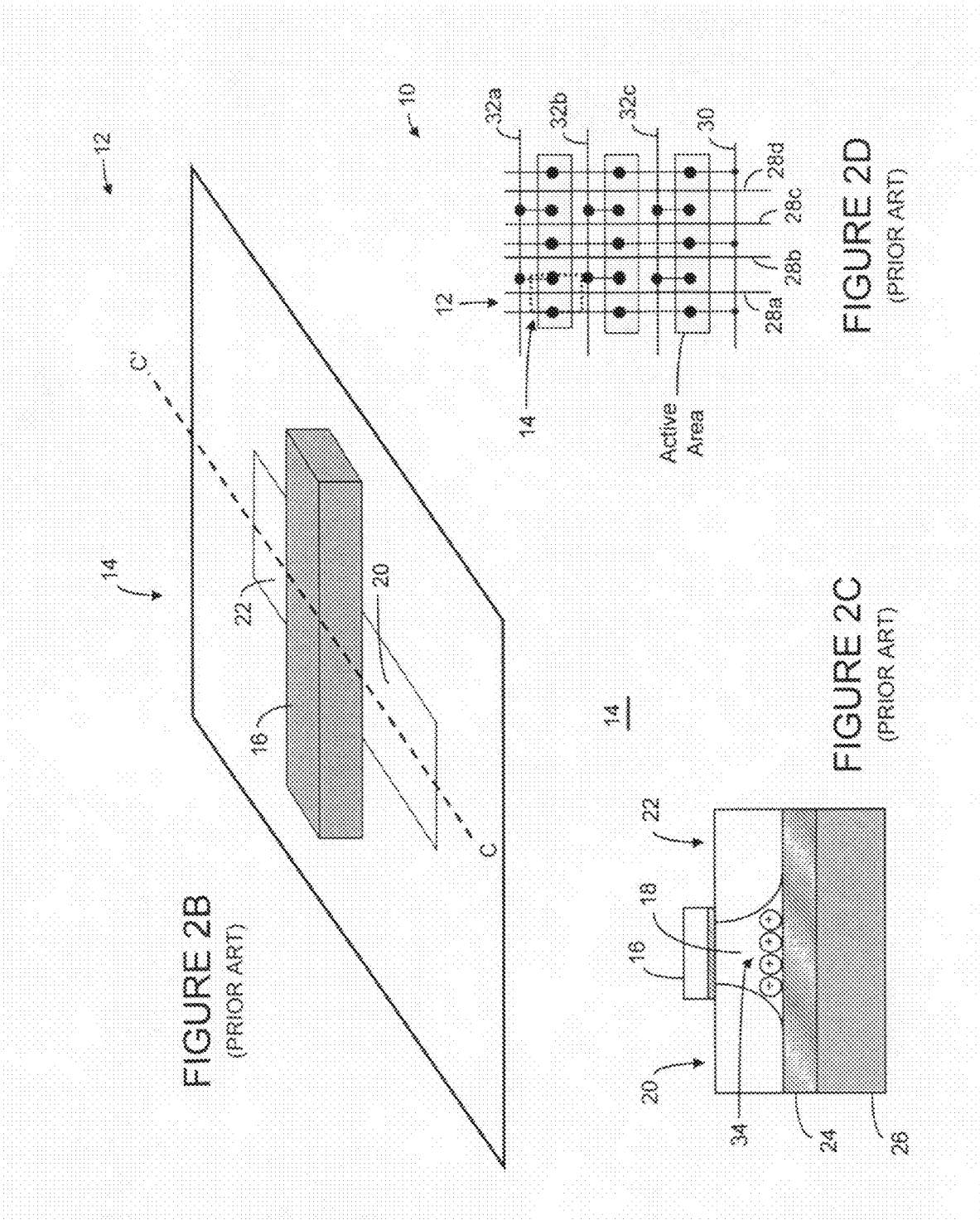

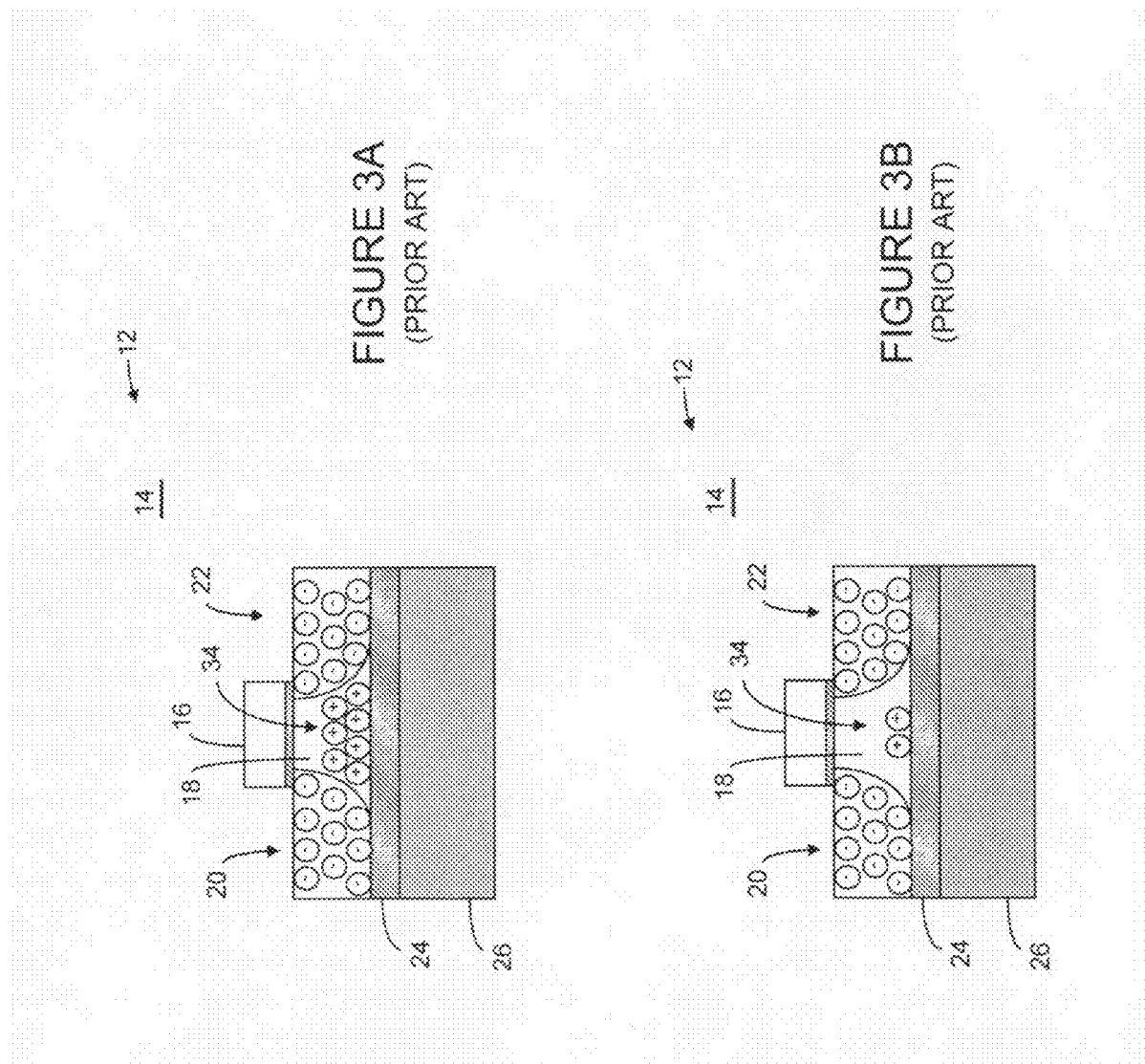

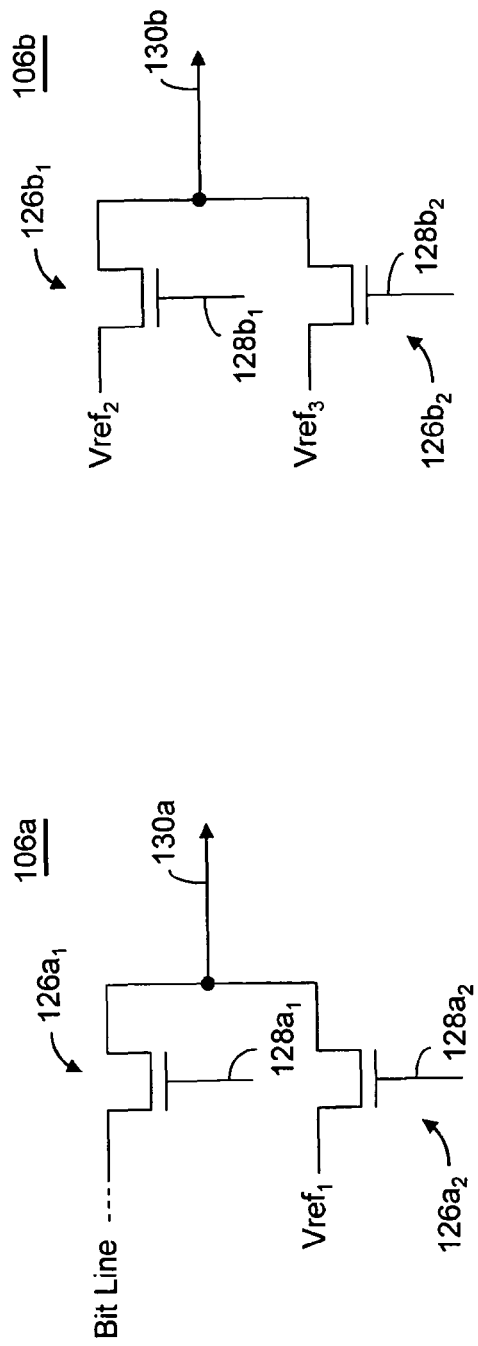

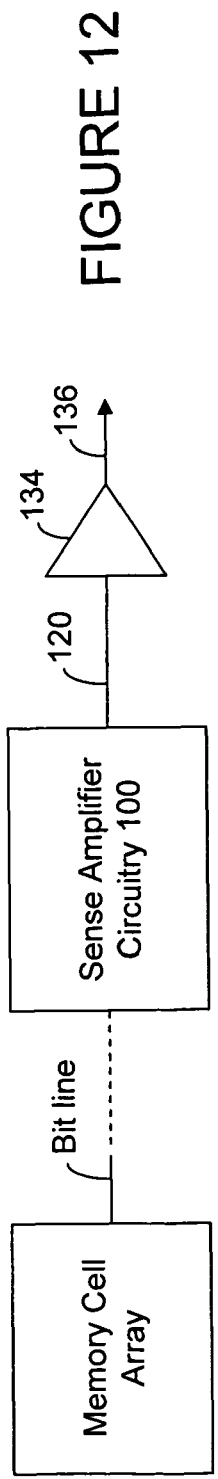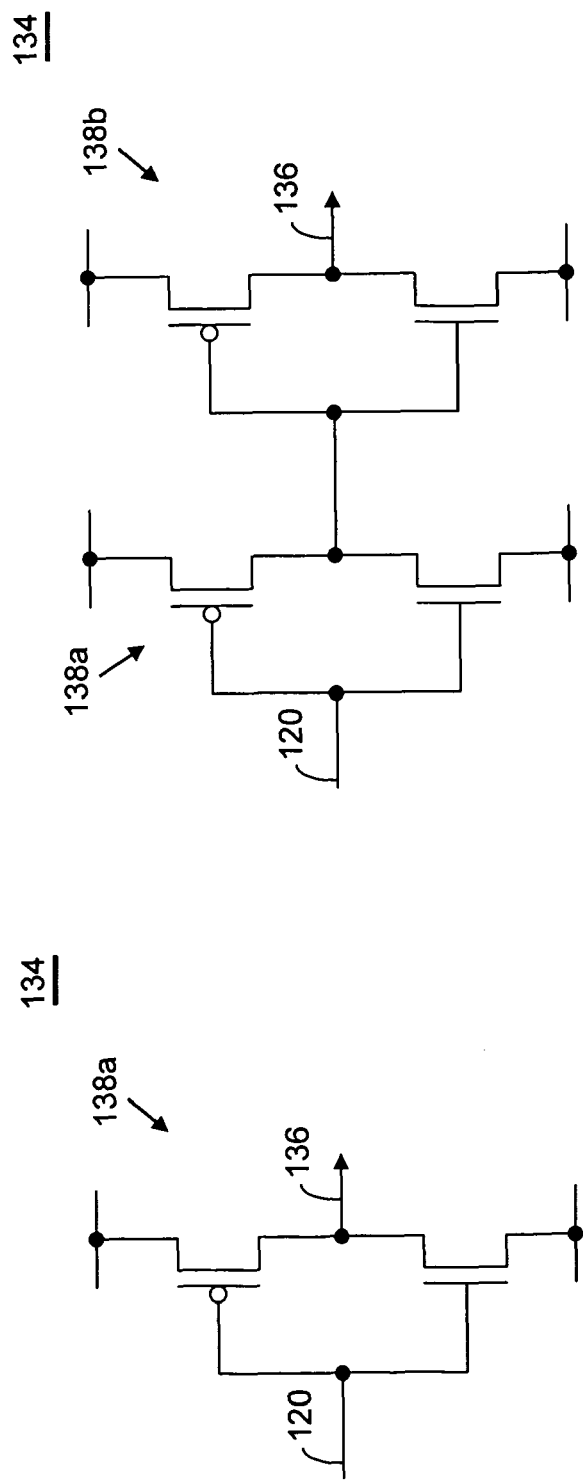

SENSE AMPLIFIER CIRCUITRY FOR INTEGRATED CIRCUIT HAVING MEMORY CELL ARRAY, AND METHOD OF OPERATING SAME

RELATED APPLICATION

This application claims priority to U.S. Provisional Application Ser. No. 60/967,605, entitled "Sense Amplifier Circuitry for Integrated Circuit Having Memory Cell Array, and Method of Operating Same", filed Sep. 6, 2007; the contents of this provisional application are incorporated by reference herein in their entirety.

INTRODUCTION

In one aspect, the present inventions described and illustrated herein relate to an integrated circuit device having a memory cell array and sense amplifier circuitry to detect, sense, sample and/or determine a data state of the memory cells in the array. More particularly, in one aspect, the present inventions relate to an integrated circuit having memory cell array including a plurality of memory cells (for example, memory cells having an electrically floating body in which a charge is stored) wherein sense amplifier circuitry is selectively coupled to one or more memory cells to detect, sense, sample and/or determine a data state of the one or more memory cells.

Briefly, with reference to FIG. 1, memory cell array 10 typically includes a plurality of memory cells 12 arranged in a matrix of rows and columns. A row address decoder enables one or more rows to be read by sensing circuitry (for example, a plurality of sense amplifiers). A column decoder, in response to an address, selects one or more of the outputs of the data sensing circuitry.

One type of dynamic random access memory cell is based on, among other things, a floating body effect of SOI transistors. (See, for example, U.S. Pat. No. 6,969,662, U.S. Patent Application Publication 2006/0131650 and U.S. Patent Application Publication 2007/0058427). In this regard, the memory cell may consist of a partially depleted (PD) or a fully depleted (FD) SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of cell is determined by the concentration of charge in the body of the transistor.

With reference to FIGS. 2A, 2B, 2C and 2D, memory cell array 10 may include a plurality of memory cells 12, each consisting of transistor 14 having gate 16, an electrically floating body region 18, source region 20 and drain region 22. The body region 18 is disposed between source region 20 and drain region 22. Moreover, body region 18 is disposed on or above region 24, which may be an insulation region (for example, in SOI material) or non-conductive region (for example, in bulk-type material). The insulation or non-conductive region may be disposed on substrate 26.

Data is written into or read from a selected memory cell by applying suitable control signals to a selected word line(s) 28, and/or a selected bit line(s) 32. The source line (30) is a common node in a typical implementation though it could be similarly decoded. In response, charge carriers are accumulated in or emitted and/or ejected from electrically floating body region 18 wherein the data states are defined by the amount of carriers within electrically floating body region 18.

Notably, the entire contents of U.S. Pat. No. 6,969,662, U.S. Patent Application Publication 2006/0131650 and U.S. Patent Application Publication 2007/0058427, including, for example, the features, attributes, architectures, configurations, materials, techniques and advantages described and illustrated therein, are incorporated by reference herein.

As mentioned above, memory cell 12 of memory cell array 10 operates by accumulating in or emitting/ejecting majority carriers (electrons or holes) 34 from body region 18 of, for example, N-channel transistors. (See, FIGS. 3A and 3B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 3A). Emitting or ejecting majority carriers 34 from body region 18 via, for example, forward biasing the source/body junction and/or the drain/body junction, is representative of a logic low or "0" data state. (See, FIG. 3B).

Several arrangements, layouts and techniques have been proposed to read and write the data stored in an electrically floating body type transistor. For example, a current sense amplifier (cross-coupled type) may be employed to compare the cell current to a reference current, for example, the current of a reference cell. From that comparison, it is determined whether the memory cell contained a logic high data state (relatively more majority carriers contained within body region) or logic low data state (relatively less majority carriers contained within body region). The differences of the charge stored in the body of the transistor affect the threshold voltage of the transistor, which in turn affects the current conducted by the transistor when switched into its conductive state.

In particular, the sense amplifier (for example, a cross-coupled sense amplifier) typically includes an input/output connected to an associated bit line and an input connected to a reference current generator. In operation, the sense amplifier compares the current conducted by the memory cell with a reference current. The magnitude of the reference current generally lies between the magnitudes of the currents conducted in the logic high data state and logic low data state of the memory cell. The sense amplifier compares the reference current to the current produced by the memory cell (the current varies depending on whether the memory cell is either in a logic high data state or logic low data state). Based on that comparison, the sense amplifier generates or outputs an output signal having a positive or negative polarity, depending upon whether the memory cell stored a logic high or a logic low binary data state. (See, for example, U.S. Pat. No. 6,567,330; "Memory Design Using a One-Transistor Cell on SOI", IEEE Journal of Solid-State Circuits, Vol. 37, No. 11, November 2002; and U.S. Patent Application Publication 2006/0126374).

SUMMARY OF CERTAIN ASPECTS OF THE DISCLOSURE

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, certain of the present inventions are directed to an integrated circuit device comprising a memory cell array having a plurality of memory cells and sense amplifier circuitry, coupled to the memory cell array, to sense a data state stored in a memory cell wherein the memory cell is one of the plurality of the memory cells in the memory cell array. In one embodiment, the sense amplifier circuitry includes first and second capacitors, a first input electrically coupled to (i) the memory cell to receive a signal which is representative of the data state stored in the memory cell and (ii) a first terminal of the first capacitor, and a second input electrically coupled to (i) a first predetermined voltage and (ii) a first terminal of the second capacitor. The sense amplifier circuitry of this embodiment further includes a first current source and a first transistor (for example, p-channel type transistor or n-channel type transistor) having a gate, a first region and a second region, wherein the gate is electrically coupled to the second terminals of the first and second capacitors, and the first region is electrically coupled to a first terminal of the first current source.

In operation, during a sense phase of operation of the sense amplifier circuitry, the sense amplifier circuitry senses the data state stored in the memory cell based on the signal which is representative of the data state stored in the memory cell. Indeed, the trip voltage of the sense amplifier circuitry may be correlated to a ratio of the capacitances of the first and second capacitors.

In one embodiment, the sense amplifier circuitry further includes first and second selection circuits. The first selection circuit may be disposed between the first input and the memory cell array to electrically couple the memory cell to the first input during the sense phase of operation of the sense amplifier circuitry. The second selection circuit may be disposed between the second input and the first predetermined voltage to responsively couple the first predetermined voltage to the second input during the sense phase of operation. Indeed, in one embodiment, in operation, the second selection circuit, during a precharge phase of operation of the sense amplifier circuitry, electrically couples a second predetermined voltage to the second input. The trip voltage of the sense amplifier circuitry may be correlated to a ratio of the capacitances of the first and second capacitors multiplied by the amplitude of the second predetermined voltage.

Notably, in one embodiment, the first selection circuit, during the precharge phase of operation of the sense amplifier circuitry, electrically couples a third predetermined voltage to the first input.

The sense amplifier circuitry may also include a feedback switch to electrically couple the gate of the first transistor to, or decouple the gate of the first transistor from the first region of the transistor wherein during the sense phase of operation, the feedback switch electrically decouples the gate of the first transistor from the first region of the first transistor. Indeed, during a precharge phase of operation of the sense amplifier circuitry, the feedback switch electrically couples the gate of the first transistor from the first region of the first transistor.

In one embodiment, the sense amplifier circuitry may further include a second current source and a second transistor having a gate, a first region and a second region, wherein the gate of the second transistor is coupled to the first region of the first transistor, and the first region of the second transistor is electrically coupled to a terminal of the second current source. The output of the sense amplifier circuitry may electrically couple to the first region of the second transistor. In one aspect, during a sense phase of operation of the sense amplifier circuitry, the sense amplifier circuitry outputs a signal which is representative of the data state stored in the memory cell using the signal which is representative of the data state stored in the memory cell.

The sense amplifier circuitry may include an enable transistor, coupled (for example, capacitively coupled) to the first and/or second inputs of the sense amplifier circuitry, to responsively enable the sense amplifier circuitry to, or disable the sense amplifier circuitry from sensing the data state stored in the memory cell. Indeed, the sense amplifier circuitry, in one embodiment, may include a bit line input coupler circuit, disposed between the first input and the memory cell array, to electrically and indirectly couple the memory cell to the first input during the sense phase of operation of the sense amplifier circuitry.

As noted below, the present inventions may be implemented in conjunction with any memory cell technology, whether now known or later developed. For example, the memory cells may include one or more transistors having electrically floating body regions, one transistor-one capacitor architectures, electrically floating gate transistors, junction field effect transistors (often referred to as JFETs), thyristor-based memory cells or any other memory/transistor technology whether now known or later developed. All such memory technologies are intended to fall within the scope of the present inventions.

Moreover, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. These memory cells may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by the concentration or amount of charge contained or stored in the body region of the SOI or bulk transistor.

In another principal aspect, certain of the present inventions are directed to an integrated circuit device having a memory cell array having a plurality of memory cells and sense amplifier circuitry, coupled to the memory cell array, to sense a data state stored in a memory cell wherein the memory cell is one of the plurality of the memory cells in the memory cell array. The sense amplifier circuitry comprises first, second and third capacitors, a first input electrically coupled to (i) the memory cell to receive a signal which is representative of the data state stored in the memory cell and (ii) a first terminal of the first capacitor and a second input electrically coupled to (i) a first predetermined voltage and (ii) a first terminal of the second capacitor. The sense amplifier circuitry may further include first and second current sources and first and second transistors (for example, p-channel type transistors and/or n-channel type transistors), each transistor including a gate, a first region and a second region, wherein: the gate of the first transistor is electrically coupled to the second terminals of the first and second capacitors, the first region of the first transistor is electrically coupled to a first terminal of the first current source and a first terminal of the third capacitor, the gate of the second transistor is electrically coupled to a second terminal of the third capacitor, and the first region of the second transistor is electrically coupled to a first terminal of the second current source.

In operation, during a sense phase of operation of the sense amplifier circuitry, the sense amplifier circuitry sense the data state stored in the memory cell based on the signal which is representative of the data state stored in the memory cell. Indeed, in one embodiment, the output of the sense amplifier circuitry is electrically coupled to the first region of the transistor and, during a sense phase of operation of the sense amplifier circuitry, the sense amplifier circuitry outputs a signal which is representative of the data state of the memory cell using the signal which is representative of the data state stored in the memory cell. Notably, the trip voltage of the sense amplifier circuitry may be correlated to a ratio of the capacitances of the first and second capacitors multiplied by the amplitude of the second predetermined voltage.

In one embodiment, the sense amplifier circuitry of this aspect of the invention further includes a first feedback switch to electrically couple the gate of the first transistor to, or decouple the gate of the first transistor from the first region of the first transistor, and a second feedback switch to electrically couple the gate of the second transistor to, or decouple the gate of the second transistor from the first region of the second transistor. In operation, during the sense phase of operation of the sense amplifier circuitry, the first and second feedback switches electrically decouple the gates of the first and second transistors, respectively, from the first regions of the first and second transistors, respectively. In addition, during a precharge phase of operation of the sense amplifier circuitry, the first and second feedback switches electrically couple the gates of the first and second transistors, respectively, from the first regions of the first and second transistors, respectively.

In one embodiment, the sense amplifier circuitry further includes first and second selection circuits. The first selection circuit may be disposed between the first input and the memory cell array to electrically couple the memory cell to the first input during the sense phase of operation of the sense amplifier circuitry. The second selection circuit may be disposed between the second input and the first predetermined voltage to responsively couple the first predetermined voltage to the second input during the sense phase of operation. Indeed, in one embodiment, in operation, the second selection circuit, during a precharge phase of operation of the sense amplifier circuitry, electrically couples a second predetermined voltage to the second input. Notably, the trip voltage of the sense amplifier circuitry may be correlated to a ratio of the capacitances of the first and second capacitors multiplied by the amplitude of the second predetermined voltage.

In one embodiment, the sense amplifier circuitry may further include a third current source and a third transistor having a gate, a first region and a second region, wherein the gate of the second transistor is coupled to the first region of the first transistor, and the first region of the second transistor is electrically coupled to a terminal of the second current source. An output of the sense amplifier circuitry may electrically couple to the first region of the third transistor. In one aspect, during a sense phase of operation of the sense amplifier circuitry, the sense amplifier circuitry outputs a signal which is representative of the data state stored in the memory cell using the signal which is representative of the data state stored in the memory cell.

The integrated circuit device may include latch circuitry to latch the data state of the signal output by the sense amplifier circuitry wherein the first region of the second transistor is electrically coupled to latch circuitry. The sense amplifier circuitry may also include an enable transistor, coupled (for example, capacitively) to the first and/or second inputs of the sense amplifier circuitry, to responsively enable the sense amplifier circuitry to, or disable the sense amplifier circuitry from sensing the data state stored in the memory cell. Indeed, the sense amplifier circuitry, in one embodiment, may include a bit line input coupler circuit, disposed between the first input and the memory cell array, to electrically and indirectly couple the memory cell to the first input during the sense phase of operation of the sense amplifier circuitry.

As discussed at length herein, the present inventions may be implemented in conjunction with any memory cell technology, whether now known or later developed. For example, the memory cells may include one or more transistors having electrically floating body regions, one transistor-one capacitor architectures, electrically floating gate transistors, junction field effect transistors (often referred to as JFETs), thyristor-based memory cells or any other memory/transistor technology whether now known or later developed. All such memory technologies are intended to fall within the scope of the present inventions.

Moreover, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. These memory cells may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by the concentration or amount of charge contained or stored in the body region of the SOI or bulk transistor.

Again, there are many inventions, and aspects of the inventions, described and illustrated herein. This Summary of the Inventions is not exhaustive of the scope of the present inventions. Indeed, this Summary of the Inventions may not be reflective of or correlate to the inventions protected by the claims in this or in continuation/divisional applications hereof.

Moreover, this Summary of the Inventions is not intended to be limiting of the inventions or the claims (whether the currently presented claims or claims of a divisional/continuation application(s)) and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIG. 2B is a three dimensional view of an exemplary prior art memory cell comprised of one electrically floating body transistor (PD-SOI NMOS);

FIG. 2C is a cross-sectional view of the memory cell of FIG. 2B, cross-sectioned along line C-C';

FIG. 2D is a plan view layout (not drawn to scale) of a portion of the memory cell array of FIG. 2A;

FIGS. 3A and 3B are exemplary schematic illustrations of the charge relationship, for a given data state, of a prior art memory cell comprised of an electrically floating body transistor (N-channel type transistor);

FIGS. 5A and 5B are schematic block diagram illustrations of exemplary switches of the sense amplifier circuitry of FIG. 4, according to certain aspects and/or embodiments of the present inventions;

FIGS. 6A and 6B are schematic block diagram illustrations of exemplary input selection circuits of the sense amplifier circuitry of FIG. 4, according to certain aspects and/or embodiments of the present inventions;

FIG. 12 is a block diagram illustration of exemplary sense amplifier circuitry in conjunction with, among other things, driver circuitry, according to certain aspects and/or embodiments of the present inventions;

FIGS. 13A-13D are schematic block diagram illustrations of exemplary driver circuitry of FIG. 12, according to certain aspects and/or embodiments of the present inventions;

FIGS. 15A-15C are schematic block diagram illustrations of exemplary integrated circuit devices in which the sense amplifier circuitry and/or architecture may be implemented, wherein FIGS. 15A and 15C are logic devices (having logic circuitry and resident memory) and FIG. 15B is a memory device (having primarily function of memory), according to certain aspects of the present inventions;

Figure 1:
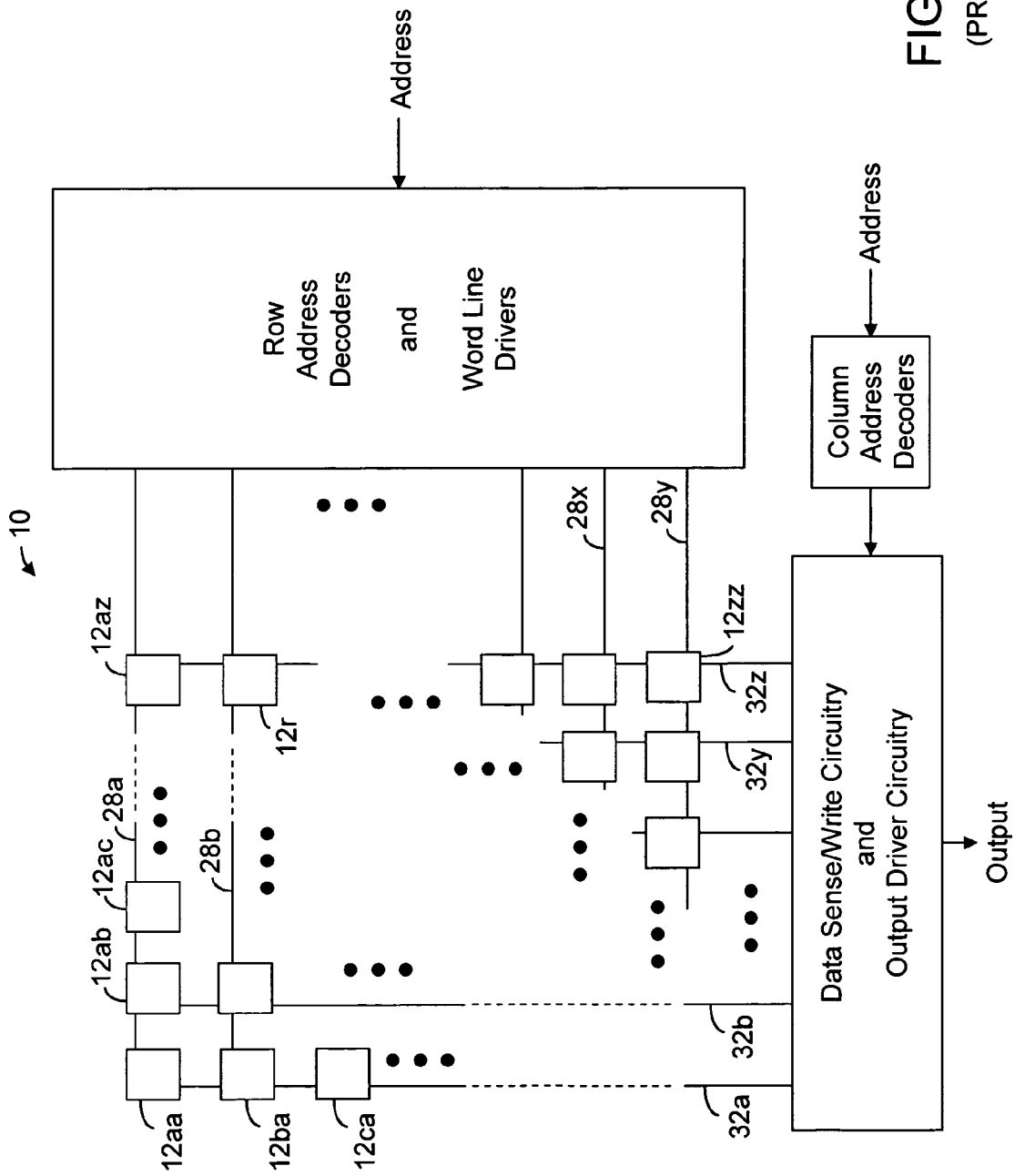
FIG. 1 is a schematic block diagram illustration of a conventional memory cell array having a plurality of memory cells arranged in an array of a plurality of rows and columns, in conjunction with row and column address decoders, word line drivers and data sense circuitry.
Figure 2A:
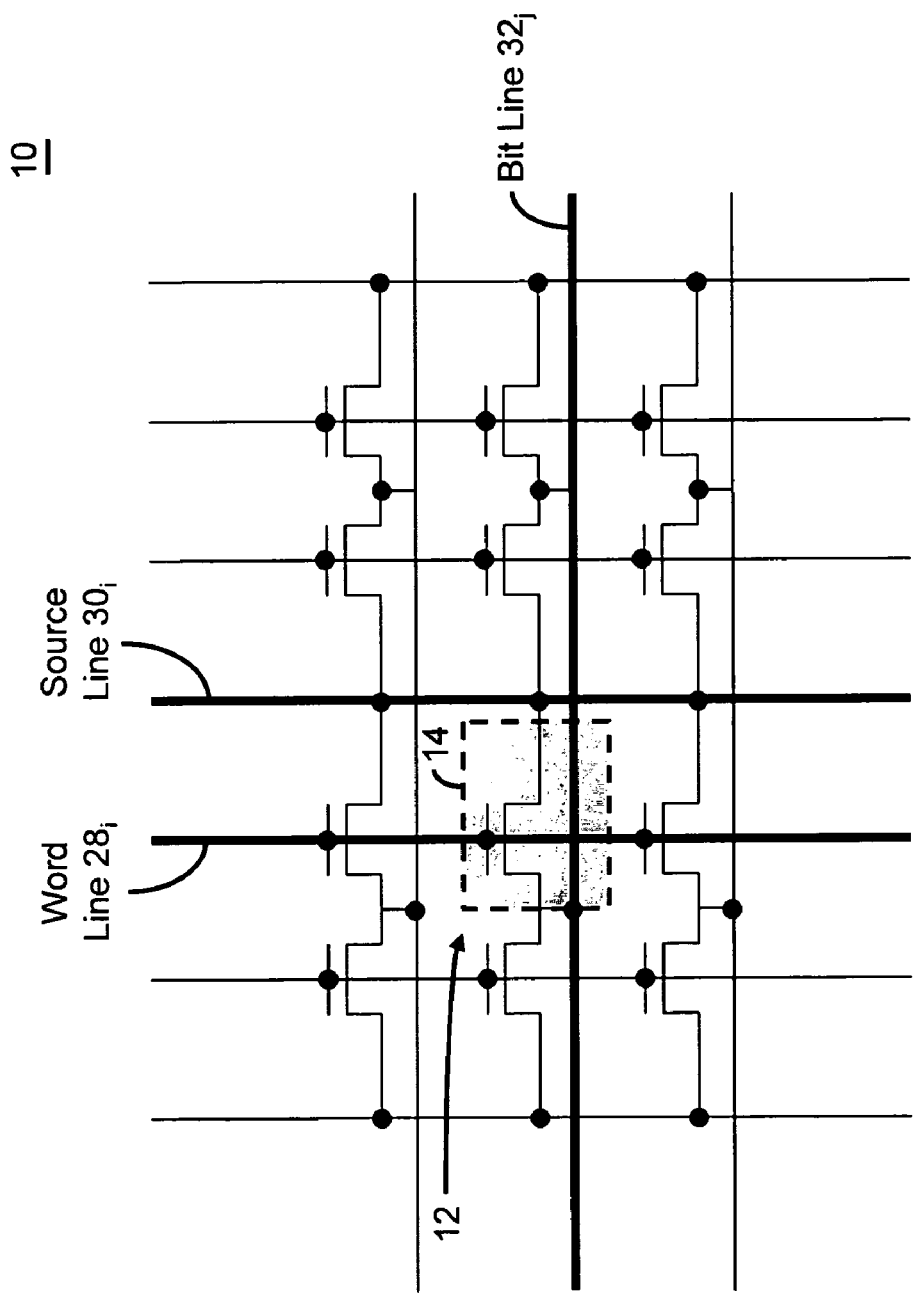
FIG. 2A is a schematic representation of a portion of a prior art memory cell array including a plurality of memory cells wherein each memory cell includes one electrically floating body transistor.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to sense amplifier circuitry and/or architectures for use with a memory cell array having a plurality of memory cells arranged, for example, in a matrix of rows and columns. In another aspect, the present inventions are directed to methods of programming, reading, controlling and/or operating the memory cells of the memory cell using sense amplifier circuitry. The memory cell array and sense amplifier circuitry and/or architectures may comprise a portion of an integrated circuit device, for example, a logic device (such as, a microcontroller, microprocessor or the like) or a portion of a memory device (such as, a discrete memory device).

Notably, the present inventions may be implemented in conjunction with any memory cell technology, whether now known or later developed. For example, the memory cells may include one or more transistors having electrically floating body regions, one transistor-one capacitor architectures, electrically floating gate transistors, junction field effect transistors (often referred to as JFETs), thyristor-based memory cells or any other memory/transistor technology whether now known or later developed. All such memory technologies are intended to fall within the scope of the present inventions.

Moreover, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. (See, for example, (1) Fazan et al., U.S. Pat. No. 6,969,662, (2) Okhonin et al., U.S. Pat. No. 7,301,838, (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530, ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"), all of which are incorporated by reference herein in its entirety). In this regard, the memory cell may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by the concentration or amount of charge contained or stored in the body region of the SOI or bulk transistor.

Figure 4:
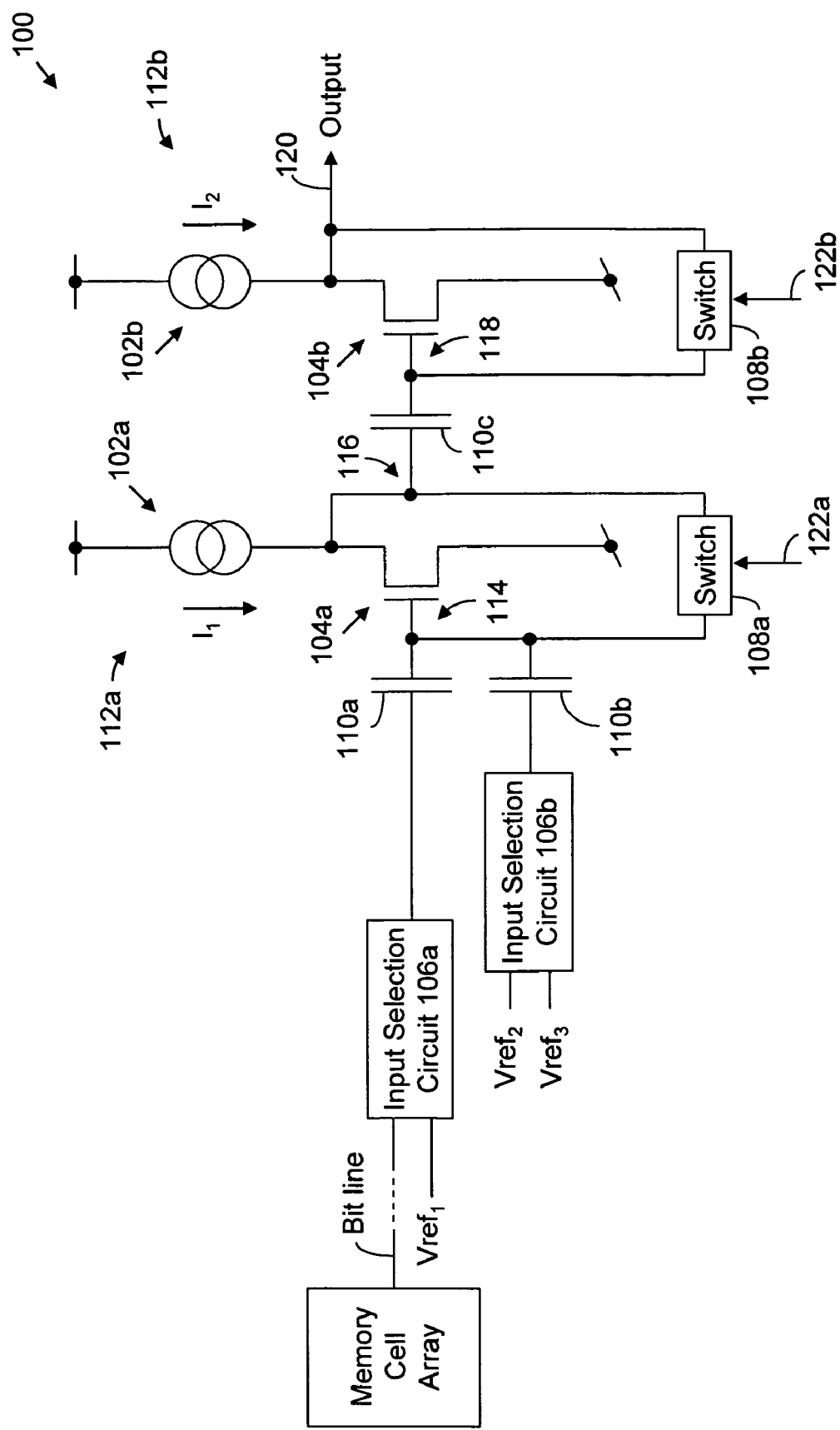
FIG. 4 is a schematic block diagram illustration of exemplary sense amplifier circuitry, according to certain aspects and/or embodiments of the present inventions.

With reference to FIG. 4, sense amplifier circuitry 100 according to one embodiment of the present inventions includes a plurality of current sources 102a and 102b connected to sense transistors 104a and 104b, respectively. The sense amplifier circuitry 100 of this embodiment further includes input selection circuitry 106a and 106b to receive a plurality of inputs and selectively and responsively provide electrical connection from one such input to the output thereof.

The sense amplifier circuitry 100 of this embodiment also includes a plurality of switches 108a and 108b. The switches 108a and 108b may be employed to configure or establish a predetermined condition or state of sense amplifier circuitry 100. The switches 108a and 108b selectively and responsively provide electrical connection from the input to the output thereof.

In addition, sense amplifier circuitry 100 includes a plurality of capacitors 110a-110c. The capacitors 110a and 110b, in conjunction with input selection circuitry 106a and 106b and switches 108a and 108b, configure or establish a predetermined condition or state of sense amplifier circuitry 100 to facilitate comparative-type sensing of information on a bit line of, for example, a memory cell array (for example, the memory cell array of FIG. 1). The information on the bit line may be representative of the data state of a memory cell coupled thereto. As noted above, the memory cell may include at least one transistor having an electrically floating body transistor which stores an electrical charge in the electrically floating body region thereof.

The capacitor 110c provides AC coupling and DC decoupling such that, in operation, capacitor 110c "decouples" first stage 112a and second stage 112b to minimize, reduce and/or eliminate any adverse impact or affects of mismatching between the stages of sense amplifier circuitry 100, or elements thereof (for example, differences in the threshold voltages of sense transistors 104a and 104b and/or differences in the currents generated by current sources 102a and 102b). In this regard, current source 102a and sense transistor 104a may be considered a first stage 112a of sense amplifier circuitry 100. Similarly, current source 102b and sense transistor 104b may be considered a second stage 112b of sense amplifier circuitry 100.

In one embodiment, in operation, sense amplifier circuitry 100 includes (i) a precharge phase, condition or state wherein certain portions and/or nodes of sense amplifier circuitry 100 are placed in a predetermined state and (ii) a data sense/sample phase, condition or state wherein information on the bit line is read, sensed, sampled, detected and/or determined. In a precharge condition or state, input selection circuit 106a provides an input of $Vref_1$ to capacitor 110a, input selection circuit 106b provides an input of $Vref_3$ to capacitor 110b. In addition, switches 108a and 108b are closed.

In one embodiment, $Vref_1$ is a voltage that is equal to or substantially equal to ground or common. Further, $Vref_3$ is a voltage that is representative of, is based on and/or relates to a midpoint between (i) the voltage corresponding to the first data state of the memory cell and (ii) the voltage corresponding to the second data state of the memory cell (the voltage difference between a first data state (for example, the voltage level or current output of the memory cell when a logic "1" or high is stored therein) and a second data state of the memory cell (for example, the voltage level or current output of the memory cell when a logic "0" or low is stored therein)). In this regard, in one embodiment, the voltage $Vref_3$ is scaled by the ratio of capacitances of capacitors 110a and 110b (to provide a suitable, predetermined and/or appropriate threshold, trigger and/or trip voltage of sense amplifier 100) of the midpoint between (i) the voltage corresponding to the first data state of the memory cell and (ii) the voltage corresponding to the second data state of the memory cell. Moreover, in this state or condition, nodes 114 and 116 are at a voltage equal to or substantially equal to the threshold voltage (Vt) of sense transistor 104a (which, in this embodiment is an N-channel type device).

Notably, as discussed in more detail below, the threshold, trigger and/or trip voltage of sense amplifier circuitry 100 may be characterized as the voltage $Vref_3$ scaled by the ratio of the capacitance of capacitor 110b ($C_{110b}$) to the capacitance of capacitor 110a ($C_{110a}$) (i.e., $V_{Bit\ Line}=Vref_3 \times C_{110b}/C_{110a}$). In one exemplary embodiment, the ratio of the capacitance of capacitors is 1/7 and $Vref_3$ is about 500 mV. In this way, the threshold, trigger and/or trip voltage of sense amplifier 100 is about 71 mV. As such, under ideal circumstances a voltage on the bit line which is less than 71 mV is sensed as a logic "0" or low and a voltage on the bit line which is greater than 71 mV is sensed as a logic "1" or high. It may be advantageous to include a voltage margin to enhance the predictability and reliability of the operation of sense amplifier 100—for example, a voltage on the bit line which is less than 50 mV or 60 mV is sensed as a logic "0" or low and a voltage on the bit line which is greater than 80 mV or 90 mV (or even 100 mV) is sensed as a logic "1" or high.

Further, node 118 is at a voltage equal to or substantially equal to the threshold voltage (Vt) of sense transistor 104b (which, in this embodiment, is an N-channel type device). As such, capacitor 110c "stores" any mismatching between sense transistors of first stage 112a and second stage 112b (via nodes 116 and 118) and/or any differences in the currents generated by current sources 102a and 102b. As mentioned above, in operation, capacitor 110c AC couples and DC "decouples" first stage 112a and second stage 112b. In this way, capacitor 110c minimizes, reduces or eliminates the adverse impact or affects of any mismatch between stages 112a and 112b, or elements thereof (for example, differences in the threshold voltages of transistors 104a and 104b).

In one embodiment, after completion of the precharge operation, wherein sense amplifier circuitry 100 is in a precharge condition or state, sense amplifier circuitry 100 may read, sense, sample and/or determine the information on bit line. In this regard, during a read operation, switches 108a and 108b are opened (via control signals applied on signal lines 122a and 122b, respectively) to thereby decouple, disable or eliminate the feedback path. Further, input selection circuit 106a electrically disconnects $Vref_1$ from capacitor 110a and electrically connects the bit line to capacitor 110a. In addition, input selection circuit 106b disconnects $Vref_3$ from capacitor 110b and electrically connects $Vref_2$ to capacitor 110b. In this embodiment, $Vref_2$ is a voltage that is equal to or substantially equal to ground/common, which may be at the same potential and/or voltage as $Vref_1$.

In response, sense amplifier circuitry 100 senses, samples and/or determines the data state of a memory cell coupled to the bit line that is coupled to sense amplifier circuitry 100 via input selection circuit 106a. Where the data state stored in such memory cell is a logic "1" or high, a current and/or charge is applied to capacitor 110a which causes the voltage on node 114 (i.e., the voltage applied to the gate of sense transistor 104a) to rise. This AC voltage is then amplified by transistor 104a resulting in a negative AC signal on node 116 (and a negative AC signal on node 118). Notably, the AC amplitude of the voltage on node 116 may be generally characterized as the AC voltage amplitude of the signal on node 114 multiplied by the gain of stage 112a (which, in one exemplary embodiment, is less than 10, for example, about 8).

This, in turn, "pulls" node 116 lower (that is, lowers the voltage at node 116). When node 116 gets "lower", capacitor 110c discharges thereby pulling node 118 lower (that is, lowers the voltage at node 118). When the AC voltage applied to the gate of sense transistor 104b gets lower, the voltage of the output of sense amplifier circuitry 100 (i.e., node 120) gets higher via the amplification of transistor 104b thereby reflecting the data state stored in such memory cell as a logic "1" or high.

In the event that the memory cell coupled to the bit line stores a logic "0" or low, little to no current and/or charge (and, as such, a sufficiently small voltage) is applied to capacitor 110a. Under these circumstances, the voltage on node 114 gets lower (i.e., the voltage applied to the gate of sense transistor 104a). This AC voltage is then amplified by transistor 104a resulting in a positive AC signal on node 116 (and a positive AC signal on node 118). This, in turn, "raises" node 116 (that is, raises the voltage at node 116). When node 116 gets "higher", capacitor 110c thereby pulls node 118 higher (that is, raises the voltage at node 118). When the AC voltage applied to the gate of sense transistor 104b gets higher, the output of sense amplifier circuitry 100 decreases or gets lower via the amplification of transistor 104b thereby reflecting the data state stored in such memory cell as a logic "0" or low. Notably, the AC amplitude of the voltage on node 120 may be generally characterized as the AC voltage amplitude of the signal on node 118 multiplied by the gain of stage 112b (which, in one exemplary embodiment, is less than 10, for example, about 8)

The read operation/phase of sense amplifier circuitry 100 may be characterized as follows. The node 114 may be characterized as a high impedance node (due essentially to the input impedance of sense transistor 104a) and as such, node 114 generally or substantially observes a charge conservation principle. In this regard, $$\Delta Q = C_{110a} \times (V_{Node\ 114} - V_{Bit\ Line} - \in + Vref_1) + C_{110b} \times (V_{Node\ 114} - Vref_2 + Vref_3 - \in)$$

$$0 = C_{110a} \times (V_{Node\ 114} - V_{Bit\ Line} - \in + Vref_1) + C_{110b} \times (V_{Node\ 114} - Vref_2 + Vref_3 - \in)$$

Solving for ($V_{Node\ 114} - \in$) and taking $Vref_1 = Vref_2 = 0$ (here, $Vref_1$ and $Vref_2$ are equal to or substantially equal to ground or common) provides:

$$(V_{Node\ 114} - \in) = ((V_{Bit\ Line} \times C_{110a}) - (C_{110b} \times Vref_3))/(C_{110a} + C_{110b}),\ \text{wherein, at equilibrium,}\ V_{Node\ 114} = \in,\ \text{and}\ V_{Bit\ Line} = Vref_3 \times C_{110b}/C_{110a}.$$

As such, where the amplitude of the $V_{Bit\ Line}$ is greater than $Vref_3 \times C_{110b}/C_{110a}$, the data state of the memory cell is read as a logic "1" or high. Conversely, where the amplitude of the $V_{Bit\ Line}$ is less than $Vref_3 \times C_{110b}/C_{110a}$, the data state of the memory cell is read as a logic "0" or low.

In one exemplary embodiment, the capacitance of capacitor 110a (i.e., $C_{110a}$) is nominally 28 fF and the capacitance of capacitor 110b (i.e., $C_{110b}$) is nominally 4 fF. Further, although not significant to the discussion immediately above, in one exemplary embodiment, the capacitance of capacitor 110c (i.e., $C_{110c}$) is nominally 5 fF.

Notably, it may be advantageous to include a suitable time delay (for example, 50 picoseconds) between the precharge operation and the read operation. In this regard, during the delay operation, the various nodes and/or elements of sense amplifier circuitry 100 may undergo "settling" before implementation of a read operation. In this way, when sense amplifier circuitry 100 undergoes a read operation, optimum, (highly) predetermined, suitable and/or proper conditions may exist which facilitates highly reliable and/or highly repetitive reading, sensing, and/or sampling of the information on bit line.

With reference to FIG. 5A, in one embodiment, switch 108a includes transistor 124a which is controlled via control signal 122a coupled to the gate thereof. Similarly, with reference to FIG. 5B, in one embodiment, switch 108b includes transistor 124b, which is also controlled via control signal 122b applied to the gate thereof. The control signals 122a and 122b may be the same signal or different signals that include the same amplitude but different temporal characteristics (i.e., one of the control signals is applied or occurs before the second control signal). Notably, switch 108 may be any circuit or device, whether now known or later developed, which controllably and responsively switches between an open state and a closed state.

With reference to FIG. 6A, in one embodiment, input selection circuitry 106a includes a plurality of transistors including transistor $126a_1$ and transistor $126a_2$. Similarly, with reference to FIG. 6B, in one embodiment, input selection circuitry 106b includes transistor $126b_1$ and transistor $126b_2$. The transistors $126a_1$, $126a_2$, $126b_1$ and $126b_2$ controlled via control signals applied to their respective gates. In one embodiment, control signals $128a_1$ and $128b_1$ are the same signals and control signals $128a_2$ and $128b_2$ are the same signals. Notably, input selection circuitry 106 may be any circuit or device (for example, conventional multiplexer circuit), whether now known or later developed, which controllably and responsively connects an input to an output.

Figure 7A:
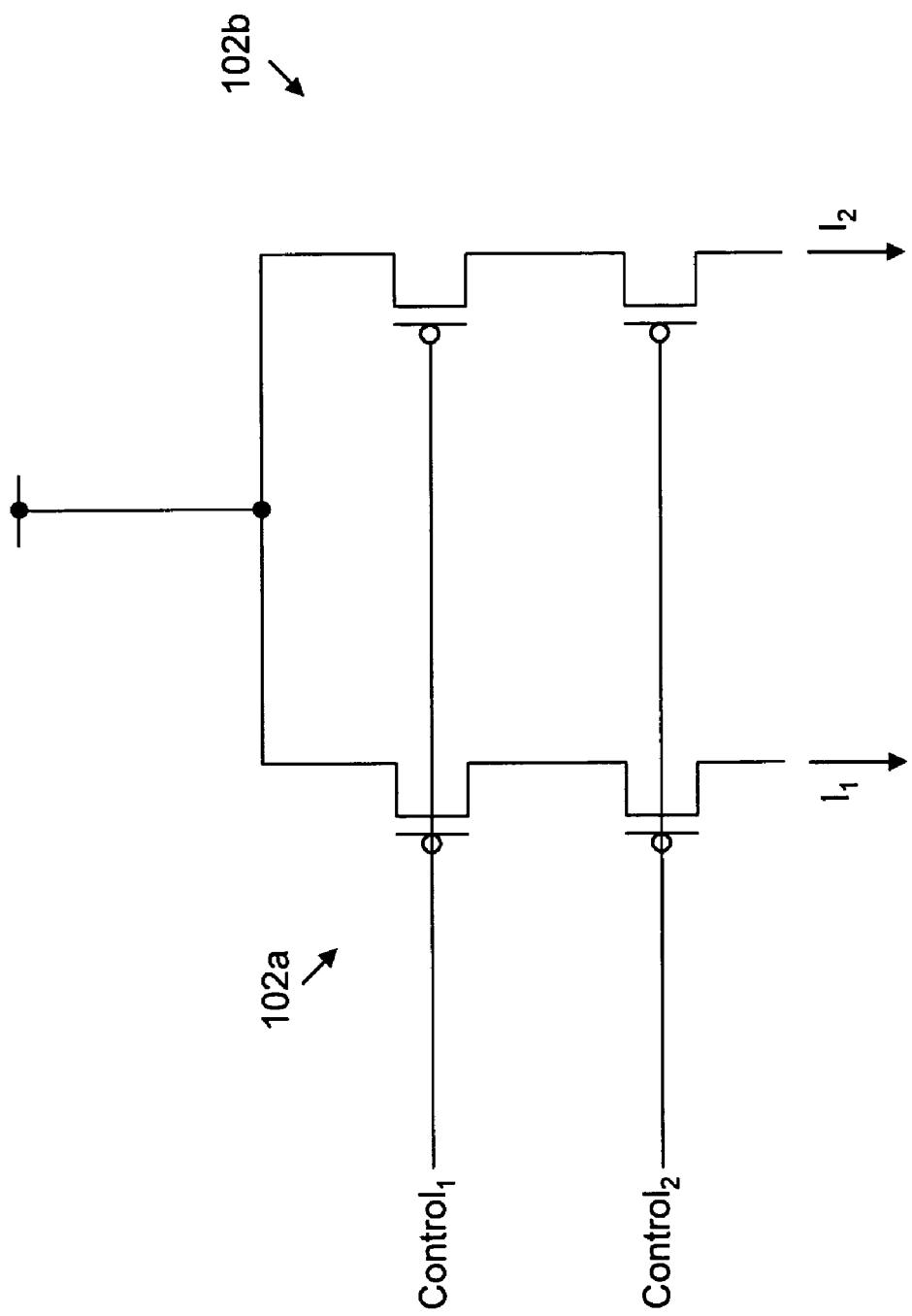
FIGS. 7A and 7B are block diagram illustrations of exemplary current sources of the sense amplifier circuitry of FIG. 4, according to certain aspects and/or embodiments of the present inventions, wherein FIG. 7B includes an enable transistor to, for example, facilitate power management when the sense amplifier is in, for example, an idle state.

With reference to FIG. 7A, in one embodiment, current sources 102a and 102b each include two transistors (in this exemplary embodiment, two P-channel type transistors). The two transistors, in combination, generate a relatively stable constant current. In one exemplary embodiment, the current is about 10 uA. Notably, current sources 102 may be any circuit or device, whether now known or later developed, which generate and output a relatively stable constant current.

It may be advantageous to incorporate control and power management capabilities into sense amplifier circuitry 100. For example, with reference to FIG. 7B, in one exemplary embodiment, transistor 130 is employed to enable certain portions of sense amplifier circuitry 100 (for example, current sources 102a and 102b) and control/manage the power consumption of the circuitry. The transistor 130 is controlled via the /Enable signal (i.e., Enable "bar" signal) which is applied to the gate thereof.

Figure 7B:
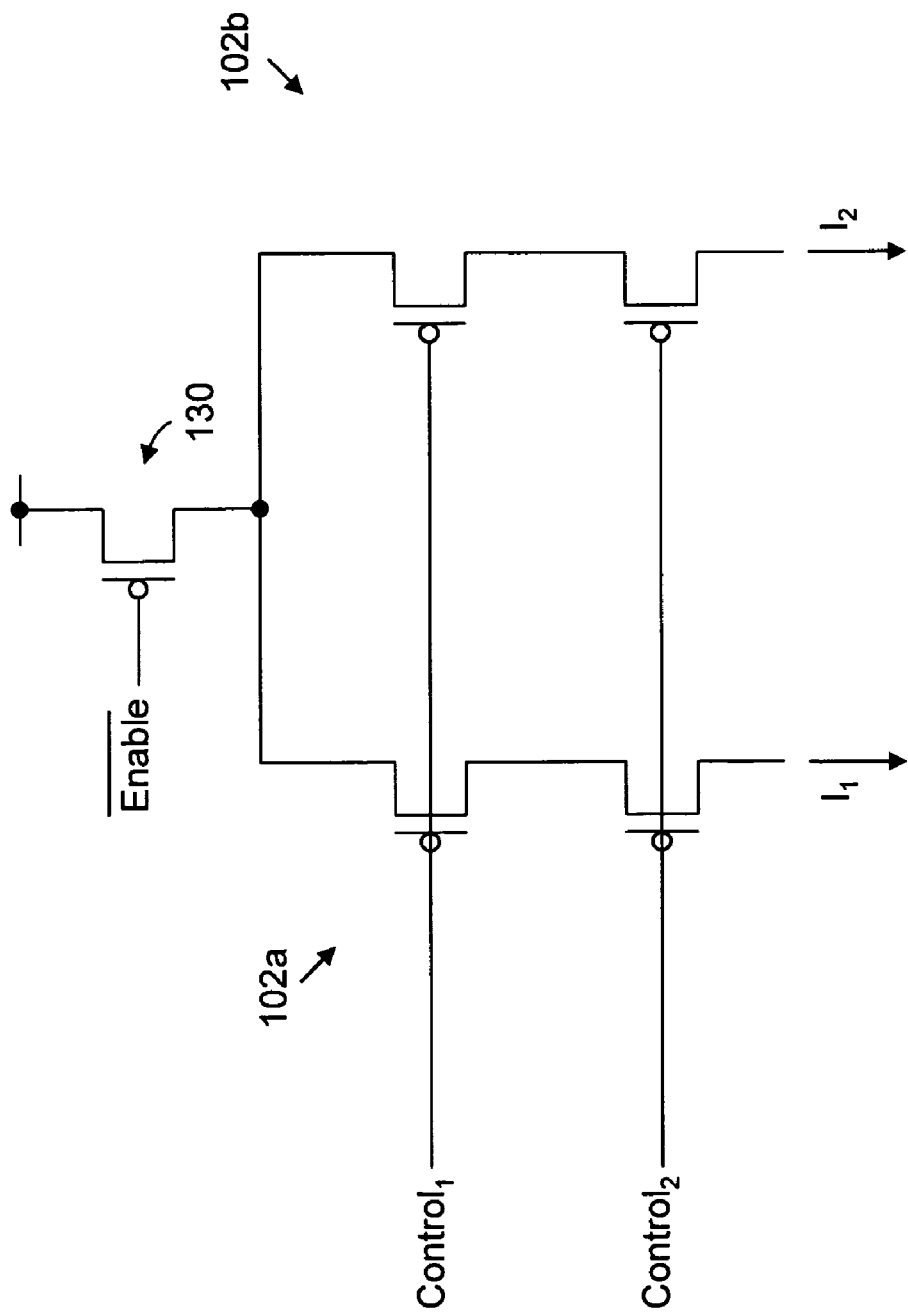
Figure 8A:
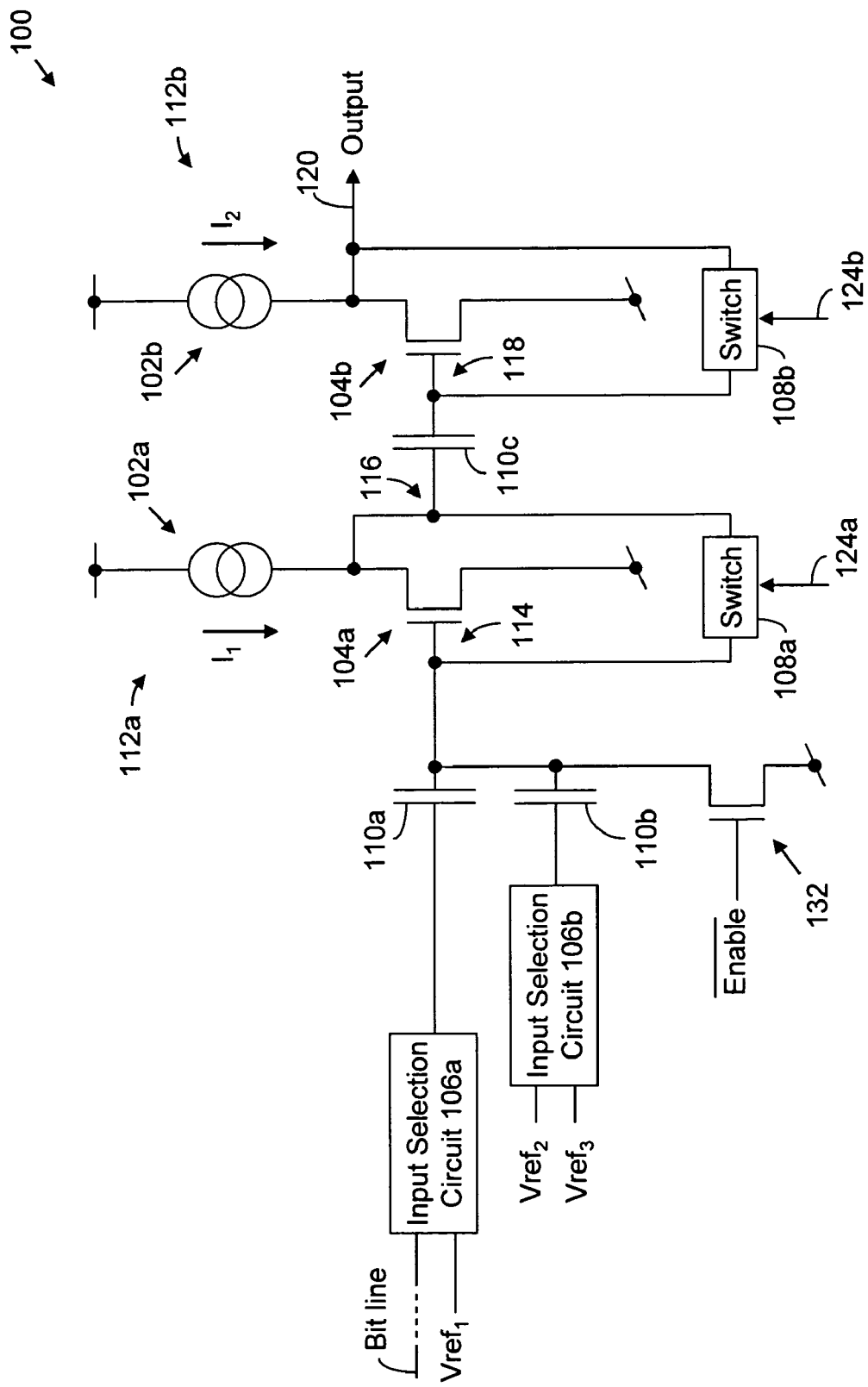
FIGS. 8A and 8B are schematic block diagram illustrations of exemplary sense amplifier circuitry, according to certain aspects and/or embodiments of the present inventions, wherein the exemplary sense amplifier circuitry of this embodiment includes an enable transistor to, for example, facilitate power management when the sense amplifier is in, for example, an idle state.
Figure 8B:
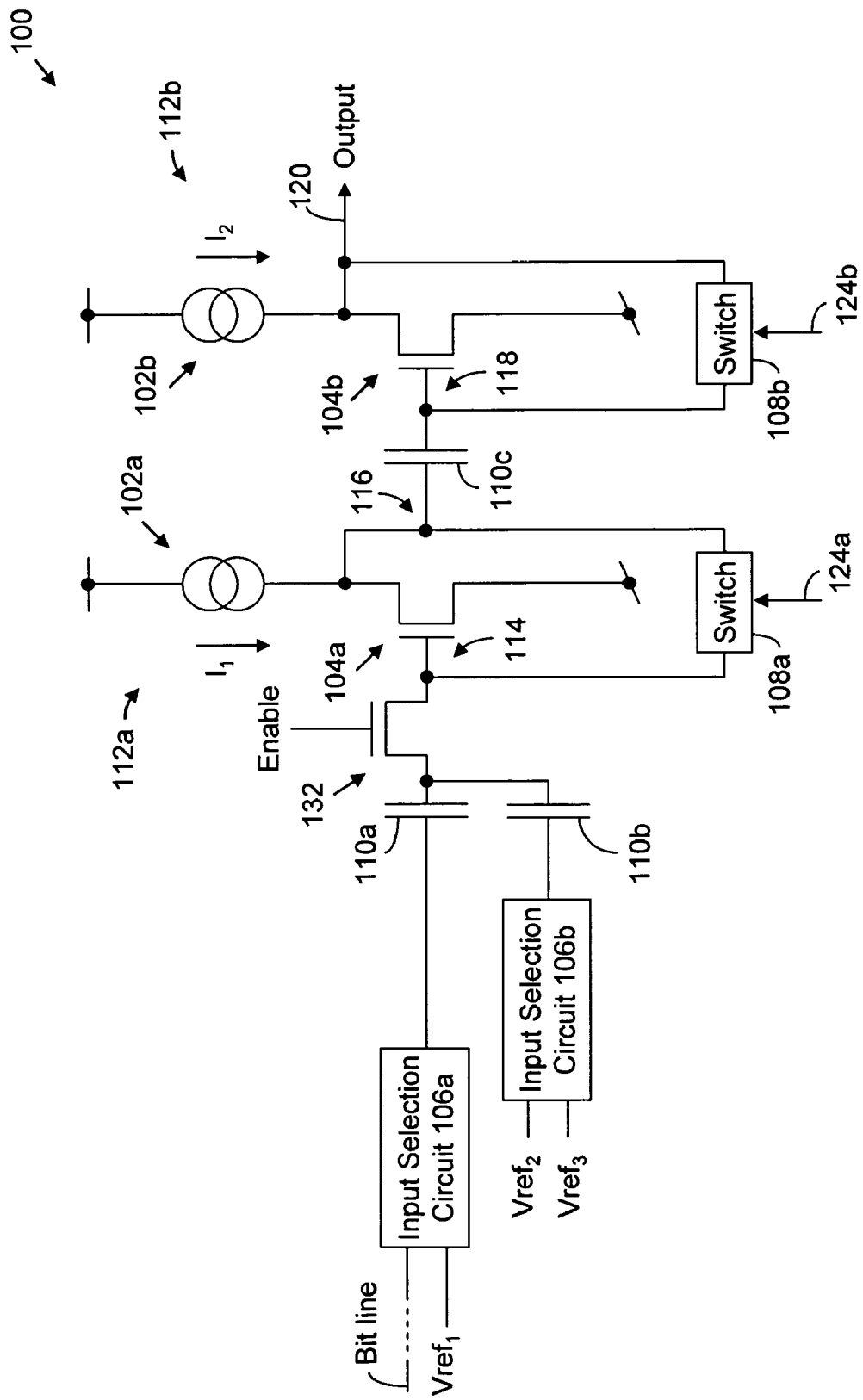

Further, with reference to FIGS. 8A and 8B, sense amplifier circuitry 100 may include one or more sense amplifier input enable transistors 132 which responsively and controllably enable and/or disable the input to first stage 112a (see, FIG. 8A), and/or couple and/or decouple the input of first stage 112a of sense amplifier circuitry 100 from input selection circuits 106a and 106b (see, FIG. 8B). In this way, certain portions of sense amplifier circuitry 100 (including, for example, first stage 112a and second stage 112b) may be electrically enabled, disabled, coupled, decoupled and/or isolated from the bit lines and memory cells of the memory cell array. In this exemplary embodiment, transistor 132 of the embodiment of FIG. 8A is controlled via the /Enable signal which is applied to the gate thereof and transistor 132 of the embodiment of FIG. 8B is similarly controlled via the Enable signal. As noted herein, although much of the circuitry is illustrated and described in the context of N-channel type transistors, the circuitry may be implemented using N-channel type transistors and/or P-channel type transistors; all such implementations are intended to fall within the scope of the present inventions. For example, enable transistors 132 of the embodiments of FIGS. 8A and 8B may be implemented using P-channel type transistors and the current sources 102 of the embodiments illustrated in FIGS. 7A and 7B may be implemented using N-channel type transistors. Moreover, as is clear from the description, sense transistors 104 may also be implemented using P-channel type transistors.

The operation of sense amplifier circuitry 100 illustrated in FIGS. 8A and 8B are similar to the operation described above with respect to the embodiment of FIG. 4. In this regard, in operation, sense amplifier circuitry 100 includes (i) a precharge condition or state wherein certain portions and/or nodes of sense amplifier circuitry 100 are placed in a predetermined state and (ii) a data sense/sample condition or state wherein information on the bit line is read, sensed, sampled, detected and/or determined.

Figure 9:
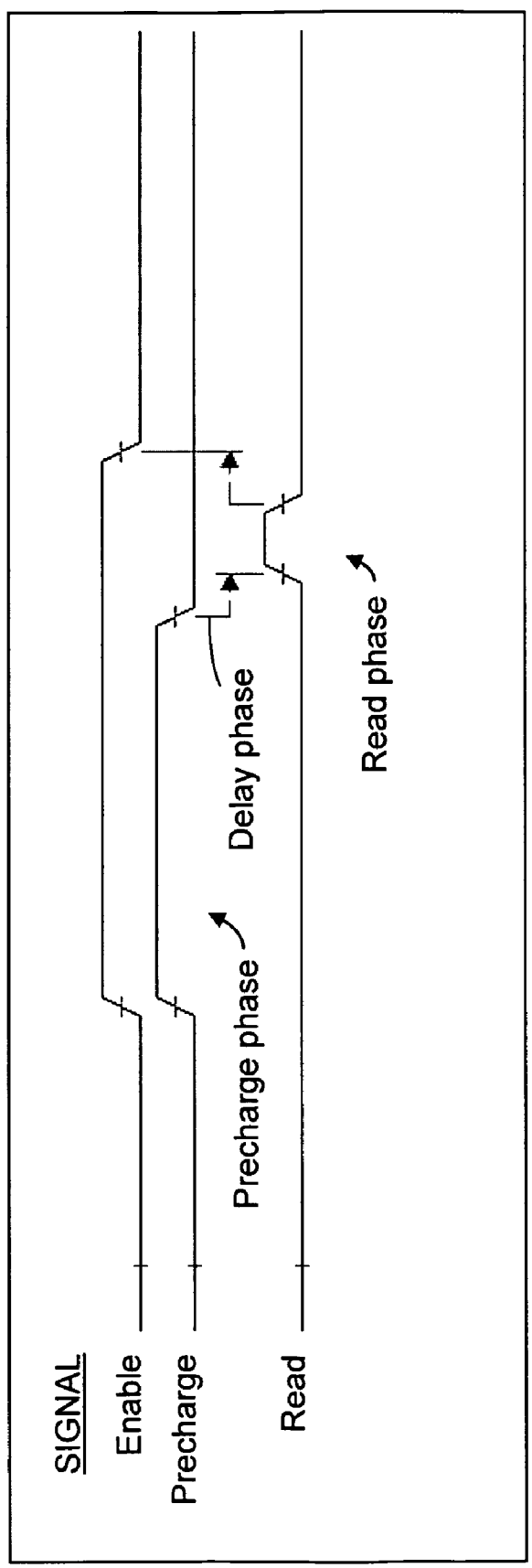
FIG. 9 illustrates exemplary timing relationships of selected control signals to (i) precharge the sense amplifier circuitry and (ii) read information on a bit line, for example, having a memory cell coupled thereto, according to an embodiment of the present inventions.

With reference to FIGS. 7B, 8A and 9, the precharge phase is initiated when an Enable signal is asserted or taken high thereby enabling or turning "on" transistor 130 and disabling or turning "off" transistor 132. Similarly, with reference to FIGS. 7B, 8B and 9, the precharge phase is initiated when an Enable signal is asserted or taken high thereby enabling or turning "on" transistors 130 and 132. In addition, a Precharge signal is also asserted or taken high thereby providing $Vref_1$ and $Vref_3$ to capacitors 110a and 110b, respectively, and switches 108a and 108b are closed.

Notably, in the context of input selection circuits 106a and 106b and switches 108a and 108b of FIGS. 5A, 5B, 6A and 6B, the Precharge signal is asserted and corresponds to control signals 122a, 122b, $128a_2$ and $128b_2$. As such, the Precharge signal enables or turns "on" transistors 124a, 124b, $126a_2$ and $126b_2$.

As indicated above, in one embodiment, $Vref_1$ is a voltage that is equal to or substantially equal to ground or common. Further, $Vref_3$ may be a voltage that is representative of, is based on and/or relates to the voltage difference between a first data state (for example, the voltage level or current output of the memory cell when a logic "1" or high is stored therein) and a second data state of the memory cell (for example, the voltage level or current output of the memory cell when a logic "0" or low is stored therein). In one embodiment, as indicated above, the voltage $Vref_3$ is scaled by the ratio of capacitances of capacitors 110a and 110b to provide a suitable, predetermined and/or appropriate threshold, trigger and/or trip voltage of sense amplifier 100; thus, in one embodiment, $Vref_3$ may be a voltage that is representative of, is based on and/or relates to the midpoint between (i) the voltage corresponding to the first data state of the memory cell and (ii) the voltage corresponding to the second data state of the memory cell.

Notably, voltage of node 116 is equal to or substantially equal to the threshold voltage (Vt) of sense transistor 104a (which, in this embodiment is an N-channel type device).

After completion of the precharge operation, sense amplifier circuitry 100 reads, senses, samples and/or determines the information on bit line, which is representative of the data state of the memory cell coupled thereto. In this regard, during a read operation, switches 108a and 108b are opened and input selection circuit 106a electrically disconnects $Vref_1$ from capacitor 110a and electrically connects the bit line to capacitor 110a. In addition, input selection circuit 106b disconnects $Vref_3$ from capacitor 110b and electrically connects $Vref_2$ to capacitor 110b. As indicated above, $Vref_2$ may be a voltage that is equal to or substantially equal to ground or common, which may be at the same potential and/or voltage as $Vref_1$.

In the context of input selection circuits 106a and 106b and switches 108a and 108b of FIGS. 5A, 5B, 6A and 6B, the Precharge signal is "de-asserted" and the Read signal is asserted. The Read signal corresponds to control signals $128a_1$ and $128b_1$. As such, the Read signal enables or turns "on" transistors $126a_1$ and $126b_1$. (See, FIGS. 6A and 6B).

In response, sense amplifier circuitry 100 reads, senses, samples and/or determines the data state of a memory cell coupled to the bit line which is coupled to sense amplifier circuitry 100. Where the data state stored in such memory cell is a logic "1" or high, a current and/or charge (and thereby a sufficiently large voltage) is applied to capacitor 110a via the bit line which causes the voltage on node 114 (i.e., the voltage applied to the gate of sense transistor 104a) to rise. This AC voltage is amplified by sense transistor 104a resulting in a negative AC signal on node 116 (and a negative AC signal on node 118). This, in turn, "pulls" node 116 "lower" (that is, lowers the voltage at node 116). When the voltage on node 116 lowers, capacitor 110c discharges thereby pulling node 118 "lower" (that is, lowers the voltage at node 118). When the AC voltage applied to the gate of sense transistor 104b is lower, the output voltage of sense amplifier circuitry 100 is "higher", via the amplification by transistor 104b, thereby reflecting the data state stored in such memory cell as a logic "1" or high.

In the event that the memory cell coupled to the bit line stores a logic "0" or low, little to no current and/or charge (and, as such, a sufficiently small voltage) is applied to capacitor 110a via the bit line. Under these circumstances, the voltage on node 114 (i.e., the voltage applied to the gate of sense transistor 104a) gets lower. This AC voltage is amplified by transistor 104a resulting in a positive AC signal on node 116 (and a positive AC signal on node 118). When the voltage on node 116 rises, capacitor 110c pulls node 118 higher (that is, raises the voltage at node 118). When the AC voltage of the voltage applied to the gate of sense transistor 104b rises, the output voltage of sense amplifier circuitry 100 (i.e., node 120) goes lower, via amplification by transistor 104b, thereby reflecting the data state stored in such memory cell as a logic "0" or low.

As noted above, the AC amplitude of the voltage on node 116 may be generally characterized as the AC amplitude of the voltage of the signal on node 114 multiplied by the gain of stage 112a (which, in one exemplary embodiment, is about 8). The AC amplitude of the voltage on node 120 may be generally characterized as the AC voltage amplitude of the signal on node 118 multiplied by the gain of stage 112b (which, in one exemplary embodiment, is about 8).

As indicated above, it may be advantageous to include a time delay (for example, a short time delay) between the precharge operation and the read operation. For example, with reference to FIG. 9, a delay phase is included between the precharge phase and the read phase. During a delay phase, the various nodes and/or elements of sense amplifier circuitry 100 may undergo "settling" before implementation of a read operation. In this way, when sense amplifier circuitry 100 undergoes a read operation, optimum, (highly) predetermined, suitable and/or proper conditions may exist which facilitates highly reliable and/or highly repetitive reading, sensing, and/or sampling of the information on bit line.

Figure 10A:
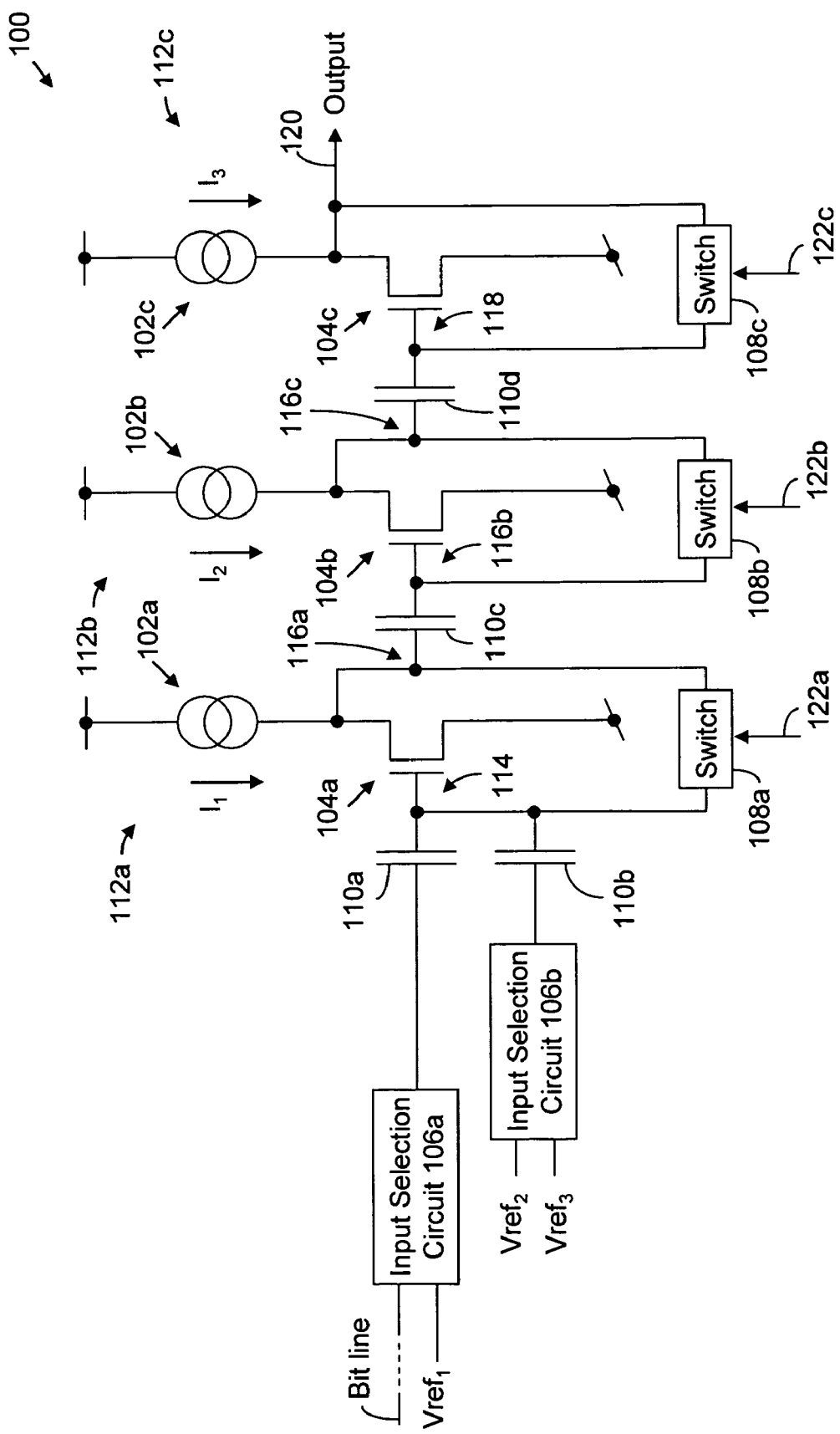
FIGS. 10A and 10B are schematic block diagram illustrations of exemplary sense amplifier circuitry, according to certain aspects and/or embodiments of the present inventions, wherein the sense amplifier circuitry of these exemplary embodiments include more than two stages.
Figure 10B:
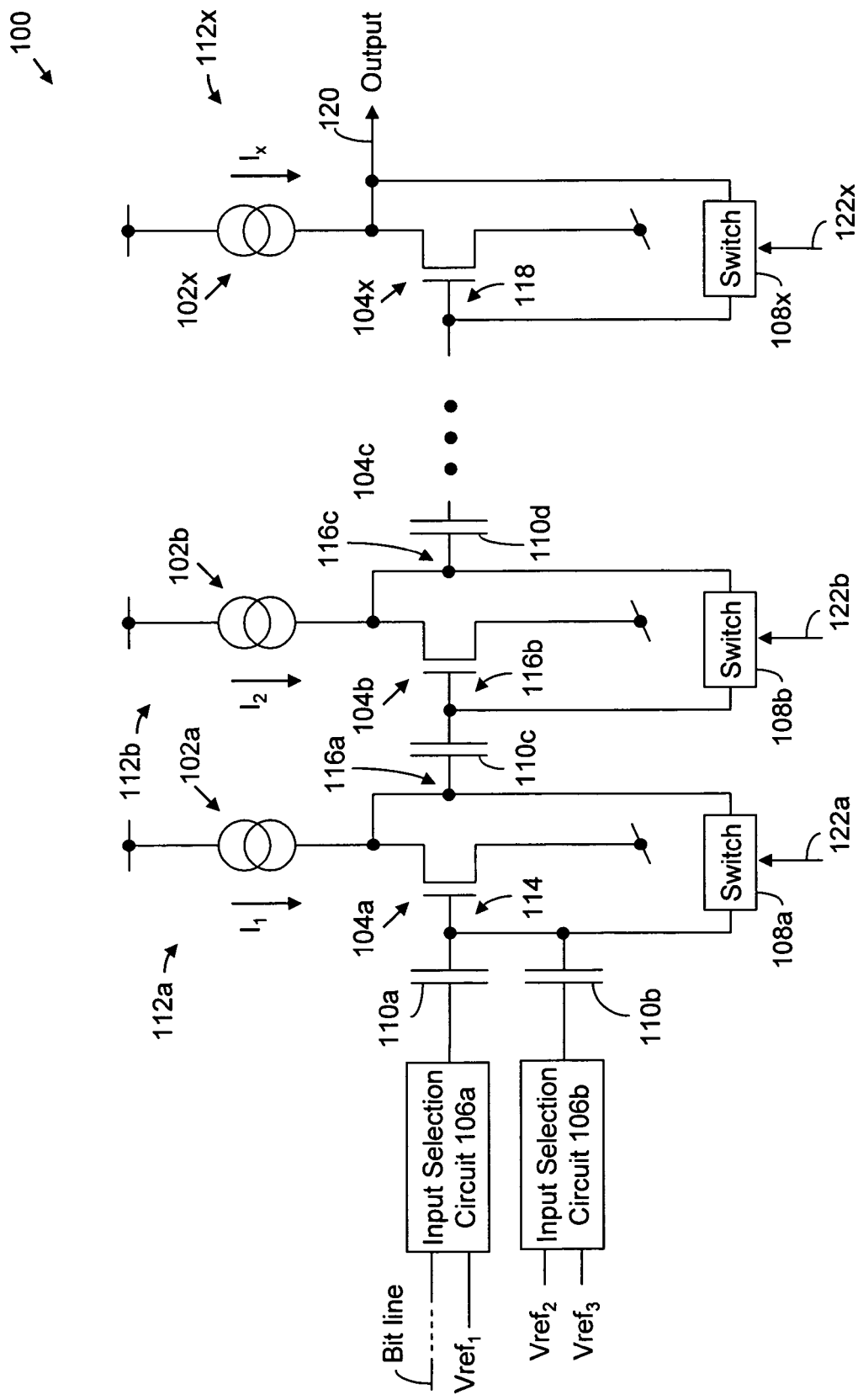
Figure 11A:
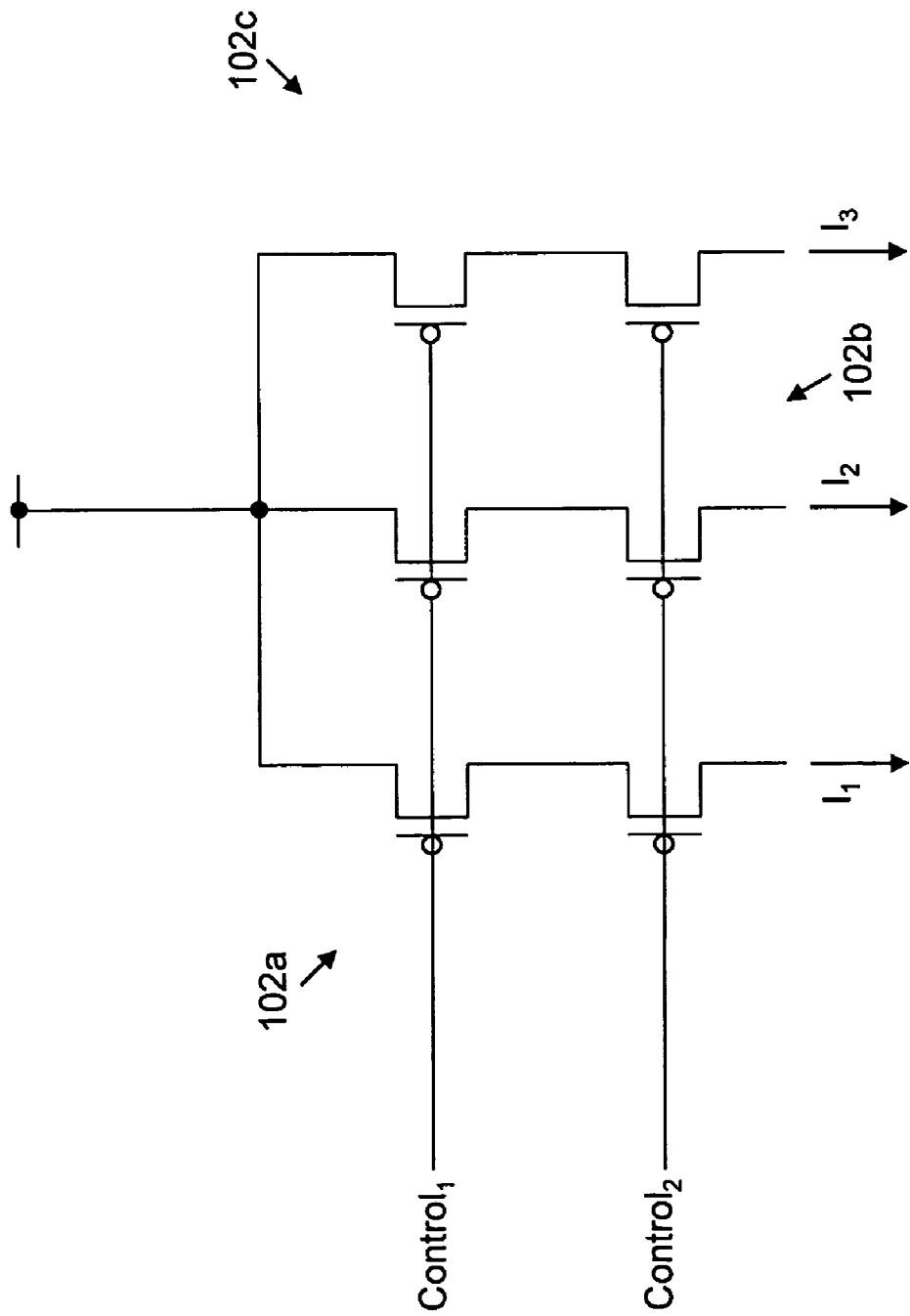
FIGS. 11A and 11B are block diagram illustrations of exemplary current sources of the sense amplifier circuitry of FIG. 10A, according to certain aspects and/or embodiments of the present inventions, wherein FIG. 11B includes an enable transistor to, for example, facilitate power management when the sense amplifier is in, for example, an idle state.
Figure 11B:
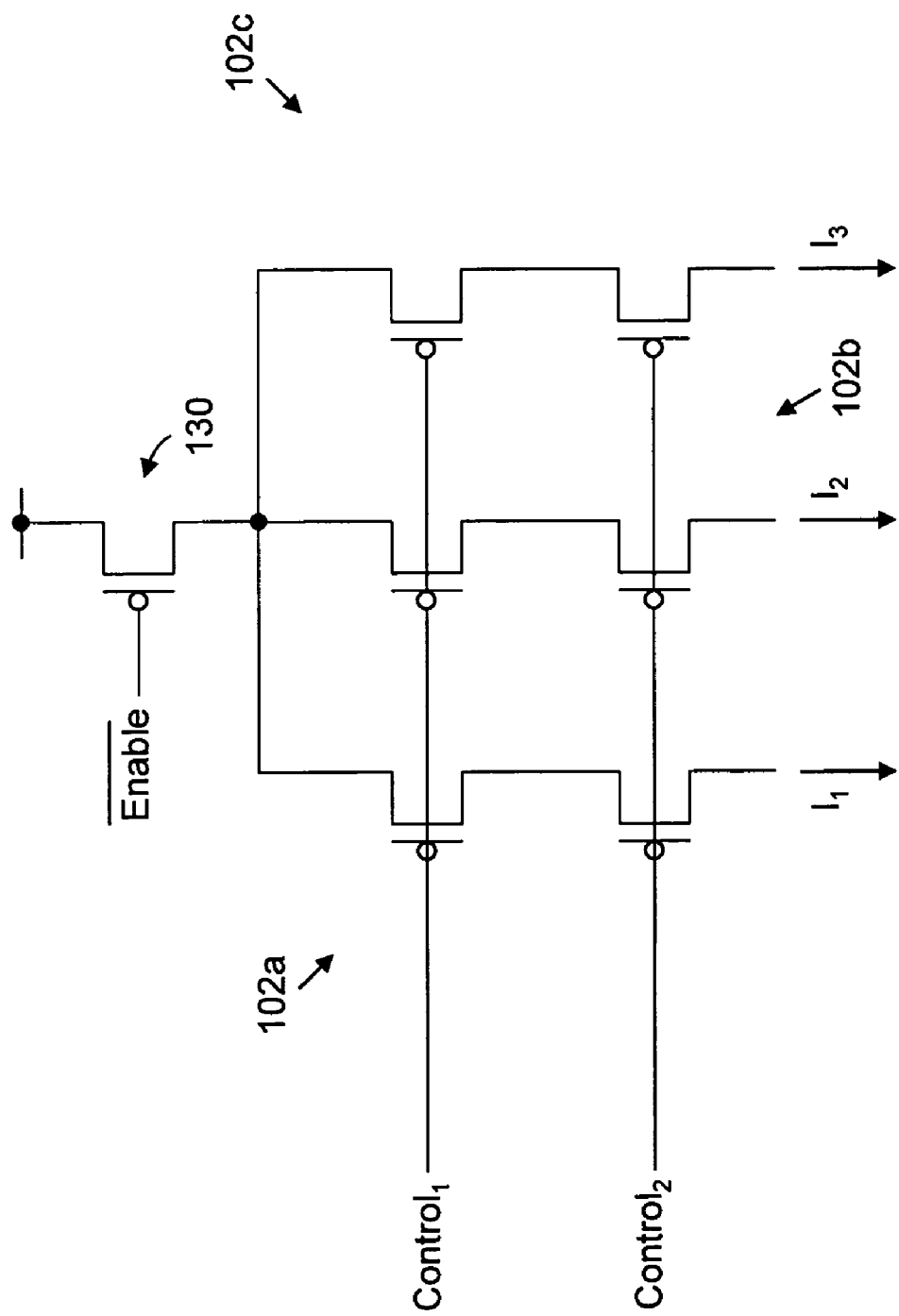

In another embodiment, sense amplifier circuitry 100 includes more than two stages 112. With reference to FIGS. 10A and 10B, sense amplifier circuitry 100 includes three stages 112a, 112b and 112c (see, FIG. 10A) or more than three stages 112 (see, FIG. 10B). The operation of exemplary sense amplifier 100 of these embodiments is similar to that described above with respect to, for example, the embodiment of FIG. 4—except, however, where an odd number of stages are employed, the signal on output 120 is "inverted" relative to those embodiments employing an even number of stages. For the sake of brevity, that discussion pertaining to the operation of FIG. 10A will not be repeated.

With reference to FIGS. 6A, 6B, 9 and 10A, in another embodiment, the clocking or control signals of input selection circuits 106a and 106b provide an output of sense amplifier circuitry 100 (i.e., the signal on output 120) that is not "inverted" relative to, for example, the data state stored in the memory cell. In this embodiment, the Precharge signal corresponds to control signals $128a_1$ and $128b_1$. As such, the Precharge signal enables or turns "on" transistors 126a1 and 126b1. Further, in this embodiment, the Read signal corresponds to control signals, 128a2 and 128b2. As such, the Read signal enables or turns "on" transistors 126a2 and 126b2.

In short, in this embodiment, during the Precharge phase, capacitor 110a is connected to the bit line and capacitor 110b is connected to Vref2. Moreover, during the Read phase, capacitor 110a is connected to Vref1 and capacitor 110b is connected to Vref3. This change in control or clocking provides an "inverted" signal on node 114 (relative to the embodiment of FIGS. 4 and 8A). A second inversion is provided by the odd number of amplification states. As such, in this embodiment, the signal on output 120 is not "inverted" relative to, for example, the data state stored in the memory cell and/or those embodiments employing an even number of stages.

Notably, the clocking/control configuration of the input signals discussed immediately above may be implemented in any of the embodiments described and/or illustrated herein. For example, a particular or predetermined phase of the output signal (relative to the bit line input or data state of the memory cell) may be obtained via the clocking/control configuration regardless of the number of stages of sense amplifier circuitry 100. It should be noted that all permutations and combinations of clocking/control configurations and stage implementations of sense amplifier circuitry 100 are intended to fall within the scope of the present inventions.

The read operation/phase of sense amplifier circuitry 100 illustrated in FIG. 10A may be characterized as follows. The node 114 may be characterized as a high impedance node (due to the input impedance of sense transistor 104a) and as such, node 114 generally or substantially observes a charge conservation principle:

$$\Delta Q = C_{110a} \times (V_{Node\ 114} + V_{Bit\ Line} - \in - Vref_1) + C_{110b} \times (V_{Node\ 114} + Vref_2 - Vref_3 - \in)$$

$$0 = C_{110a} \times (V_{Node\ 114} + V_{Bit\ Line} - \in - Vref_1) + C_{110b} \times (V_{Node\ 114} + Vref_2 - Vref_3 - \in)$$

Solving for $(V_{Node\ 114} - \in)$ and taking $Vref_1 = Vref_2 = 0$ (here, $Vref_1$ and $Vref_2$ are equal to or substantially equal to ground or common) provides:

$$(V_{Node\ 114} - \in) = ((C_{110b} \times Vref_3) - (V_{Bit\ Line} \times C_{110a})) / (C_{110a} + C_{110b}),\ \text{wherein, at equilibrium,}\ V_{Node\ 114} = \in,\ \text{and}\ V_{Bit\ Line} = Vref_3 \times C_{110b} / C_{110a}.$$

As such, like the sense amplifier embodiment, for example, of FIG. 4, where the amplitude of the $V_{Bit\ Line}$ is greater than $Vref_3 \times C_{110b}/C_{110a}$, the data state of the memory cell is read as a logic "1" or high. Conversely, where the amplitude of the $V_{Bit\ Line}$ is less than $Vref_3 \times C_{110b}/C_{110a}$, the data state of the memory cell is read as a logic "0" or low.

In one exemplary embodiment of FIG. 10A, the capacitance of capacitor 110a (i.e., $C_{110a}$) is nominally 24 fF and the capacitance of capacitor 110b (i.e., $C_{110b}$) is nominally 4 fF. Further, although not significant to the discussion immediately above, in one exemplary embodiment, the capacitance of capacitors 110c and 110d (i.e., $C_{110c}$ and $C_{110d}$, respectively) are nominally 5 fF.

Figure 13D:
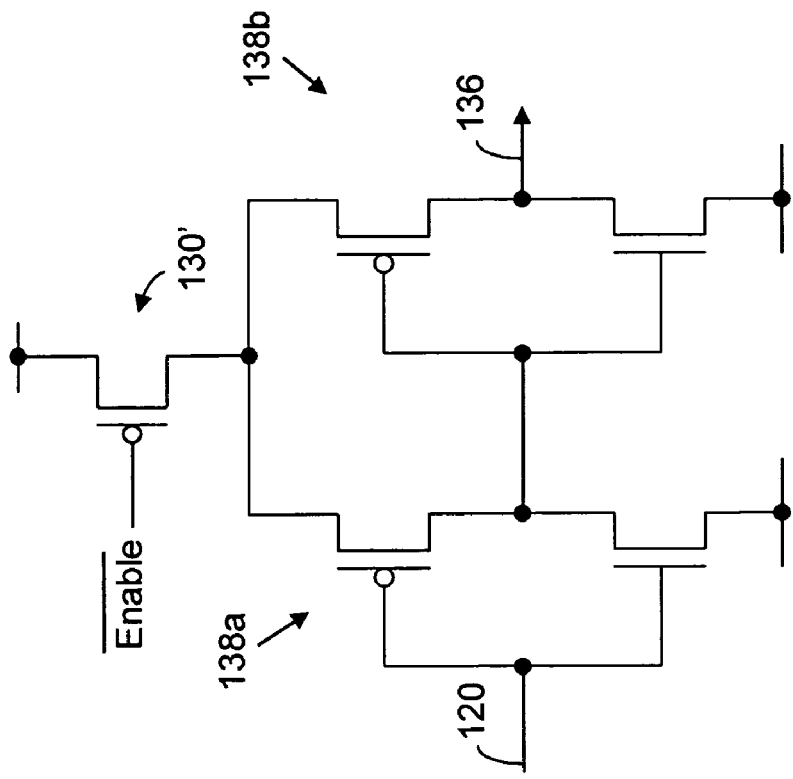
Figure 13C:
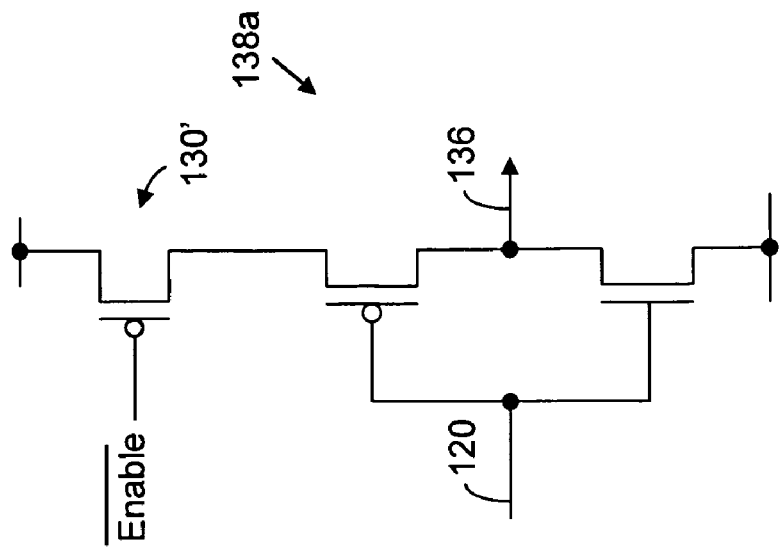

It may be advantageous to employ one or more circuits (for example, one or more drivers, inverters and/or latches) to, for example, more fully establish, obtain/provide a predetermined or proper polarity of, and/or maintain the data read, sensed, sampled and/or determined by sense amplifier circuitry 100 during the read operation and output on signal line 120. For example, with reference to FIG. 12, in one embodiment, driver circuitry 134 may be coupled to the output of sense amplifier circuitry 100. The driver circuitry 134 may include one or more inverter circuits (See, for example, FIGS. 13A-13D). Notably, FIGS. 13C and 13D include control and power management capabilities. In this regard, transistor 130' is employed to enable the driver circuitry 134 (and, in this embodiment, inverters 138) to control/manage the power consumption of such circuitry. The transistor 130' is controlled via the /Enable signal which is applied to the gate thereof.

Figure 14A:
FIG. 14A-14C are block diagram illustrations of exemplary sense amplifier circuitry in conjunction with, among other things, latch circuitry, according to certain aspects and/or embodiments of the present inventions.
Figure 14B:
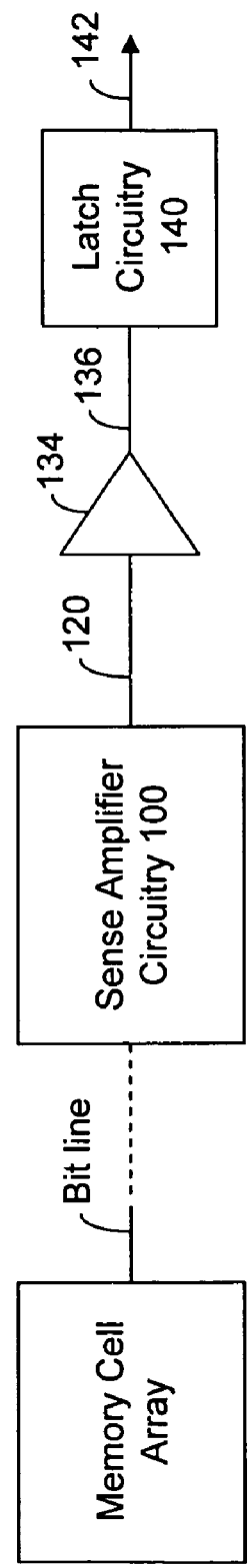
Figure 14C:
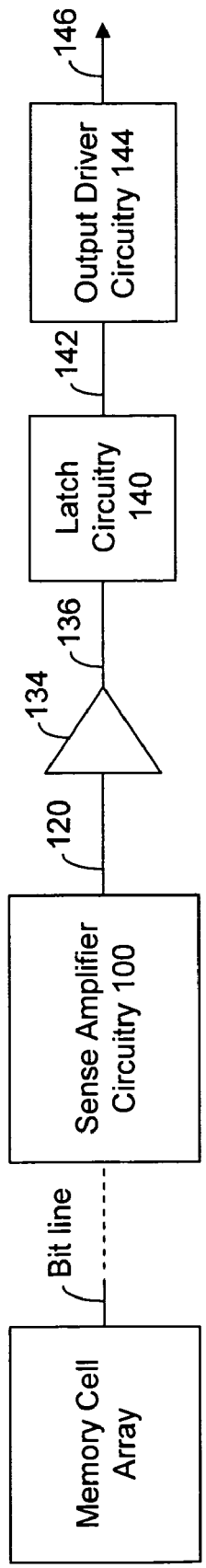

With reference to FIG. 14A-14C, it may be advantageous to employ latch circuitry and/or output driver circuitry. For example, output latch circuitry 140 may latch the output of sense amplifier circuitry 100 (see, for example, FIG. 14A) or the output of the driver circuitry 134 (see, for example, FIG. 14B). The output of the latch circuitry (i.e., signal line 142) may be applied to output driver circuitry 144 which may be coupled, for example, to a bond pad (not illustrated) of the integrated circuit device and/or to other circuitry (for example, logic circuitry—not illustrated).

Notably, such one or more circuits/circuitry (for example, one or more drivers, inverters and/or latches) which, as discussed above, more fully establish, obtain/provide a predetermined or proper polarity of, and/or maintain the data read, sensed, sampled and/or determined by sense amplifier circuitry 100 during the read operation and output on signal line 120, may be implemented in conjunction with any of the embodiments of sense amplifier circuitry 100 described and/or illustrated herein (for example, the embodiments illustrated in FIGS. 4, 8A, 8B, 10A, 10B, 18 and 19A-C).

Figure 15A:
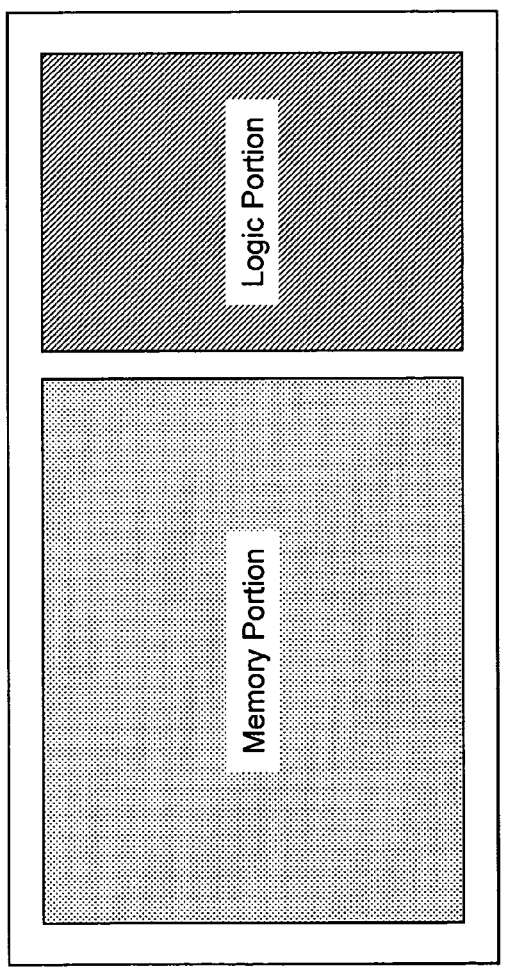
Figure 15B:
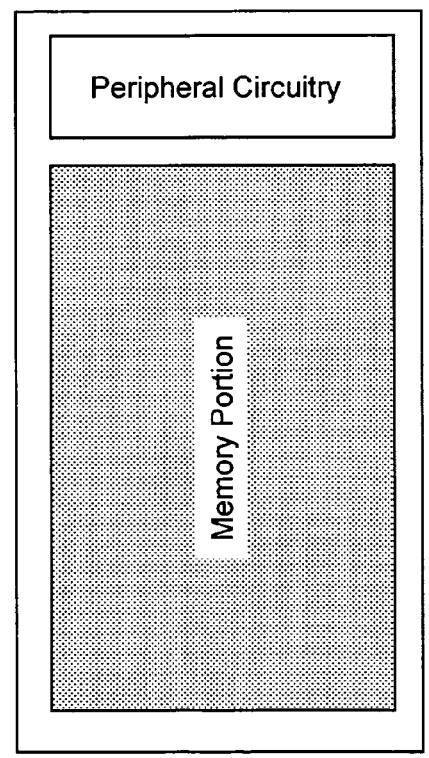
Figure 15C:
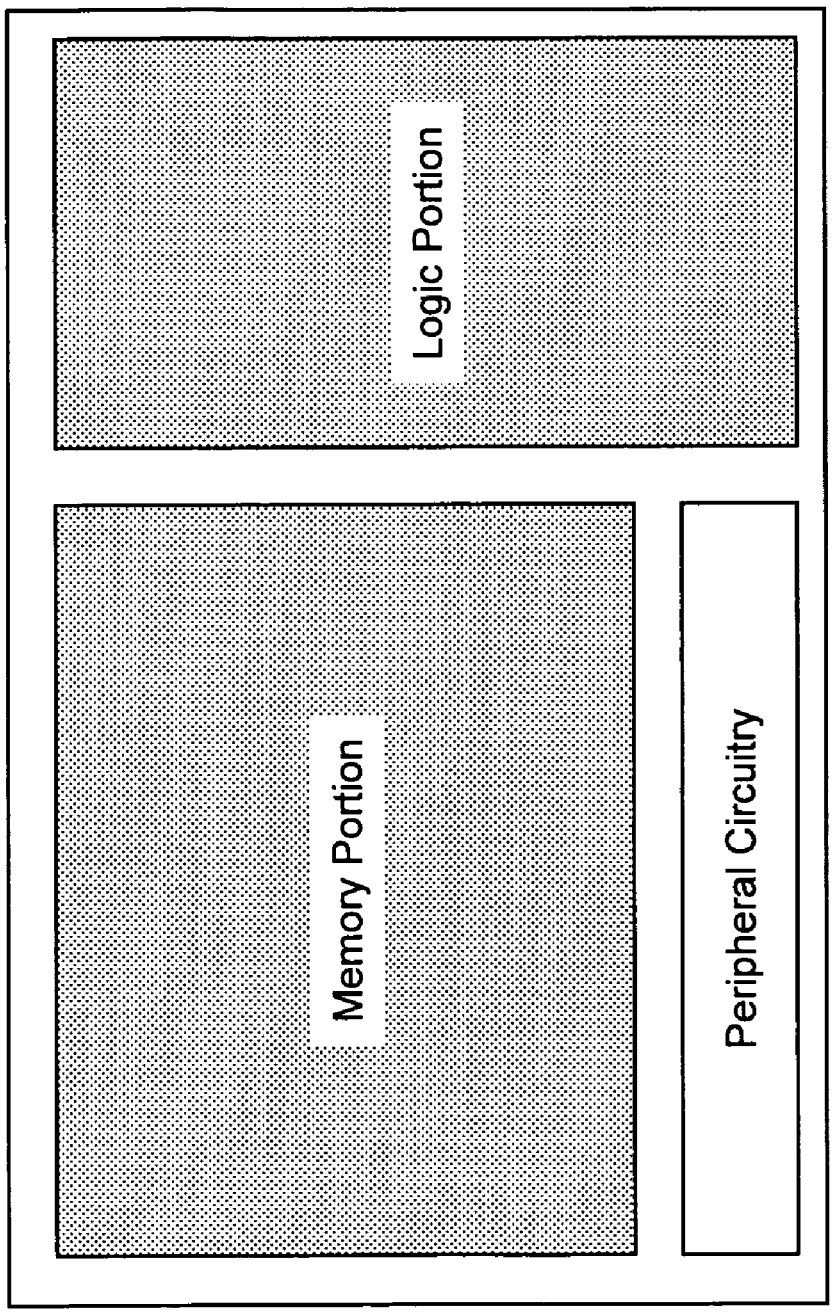

As mentioned above, the present inventions may be implemented in a logic device having a memory portion and logic portion (see, for example, FIGS. 15A and 15C), or an integrated circuit that is primarily a memory device (see, for example, FIG. 15B). The logic device may be, for example, a processor, controller, field programmable gate array, state machine, and/or a device including same. Indeed, the present inventions may be implemented in any device employing a memory array and sense amplifiers.

Further, as mentioned above, the present inventions may be employed in conjunction with any memory cell technology now known or later developed. For example, the present inventions may be implemented in conjunction with a memory array, having a plurality of memory cells each including an electrically floating body transistor. (See, for example, (1) Fazan et al., U.S. Pat. No. 6,969,662, (2) Okhonin et al., U.S. Pat. No. 7,301,838, (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530, ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"), all of which are incorporated by reference herein in its entirety). In this regard, the memory cell may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by the concentration or amount of charge contained or stored in the body region of the SOI or bulk transistor.

The memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated in detail herein)) may include P-channel and/or N-channel type transistors. Where N-channel type transistors or P-channel type transistors are employed as memory cells in the memory array(s), suitable write and read voltages are well known to those skilled in the art (and in view of the U.S. Patents and U.S. Patent Applications incorporated herein by reference).

Moreover, the present inventions may be implemented in conjunction with any memory cell array configuration and/or arrangement of the memory cell array. In this regard, integrated circuit device (for example, memory or logic device) may include a plurality of memory cell arrays, each having a plurality of memory cells, wherein the sense amplifier circuitry of the present inventions may be shared between a plurality of memory cell arrays or dedicated to one memory cell array. For example, the present inventions may be employed in any architecture or layout and/or technique of sensing data from memory cells of a memory cell array. For example, sense amplifier circuitry 100 may be employed in the architectures, circuitry and techniques described and illustrated in U.S. Non-Provisional patent application Ser. No. 11/787,718 (U.S. Patent Application Publication No. 2007/0241405), filed by Popoff, on Apr. 17, 2007, and entitled "Semiconductor Memory Array Architecture, and Method of Controlling Same", the application being incorporated herein by reference in its entirety.

Figure 16A:
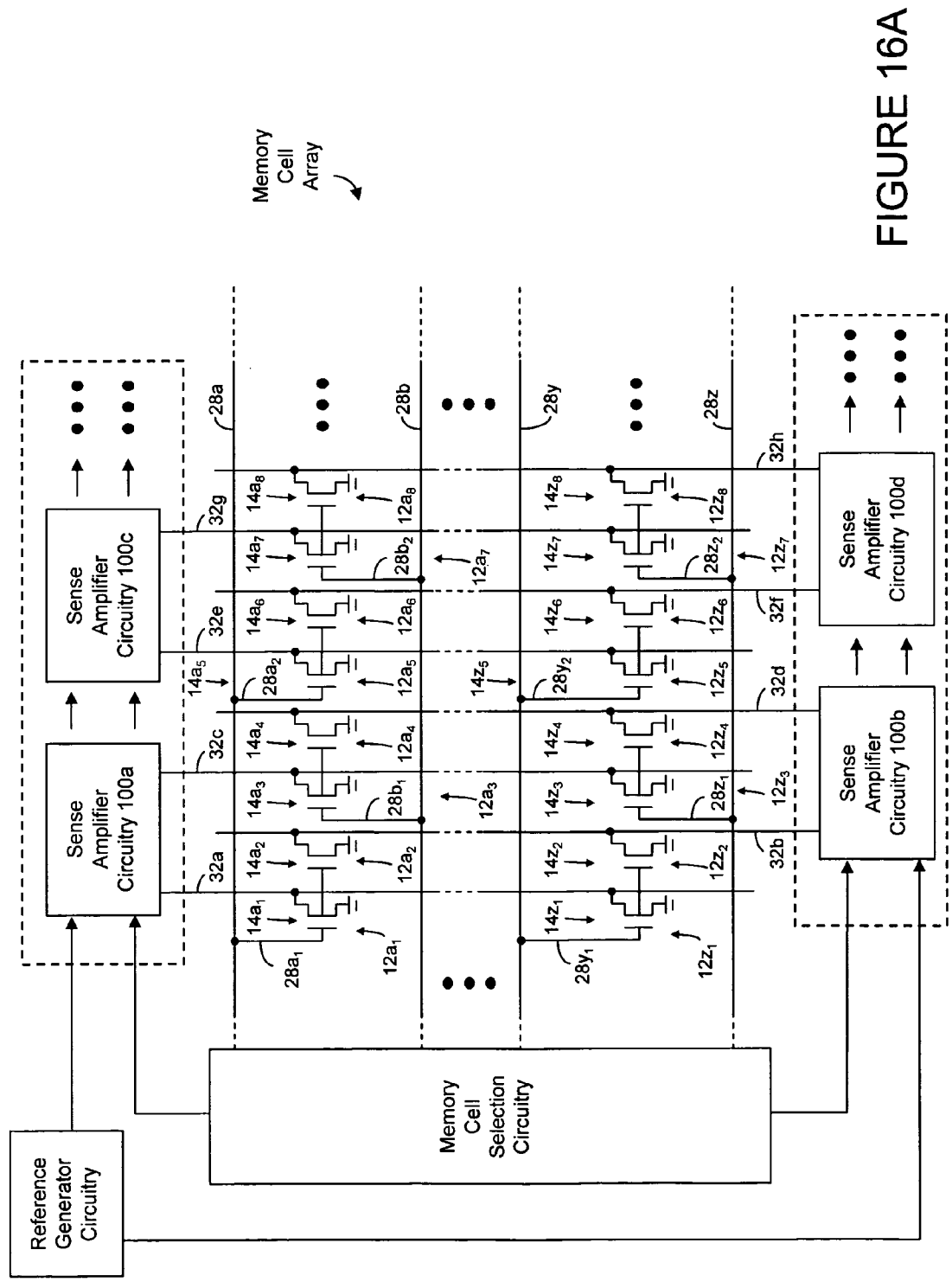
FIGS. 16A and 16B are schematic block diagram illustrations of a portion of an exemplary memory cell array architecture (as described and illustrated in U.S. Non-Provisional patent application Ser. No. 11/787,718, inventor: Popoff, filed on Apr. 17, 2007, and entitled "Semiconductor Memory Array Architecture, and Method of Controlling Same") in conjunction with sense amplifier circuitry, wherein the adjacent bit lines are connected to different sense amplifier circuitry.
Figure 16B:
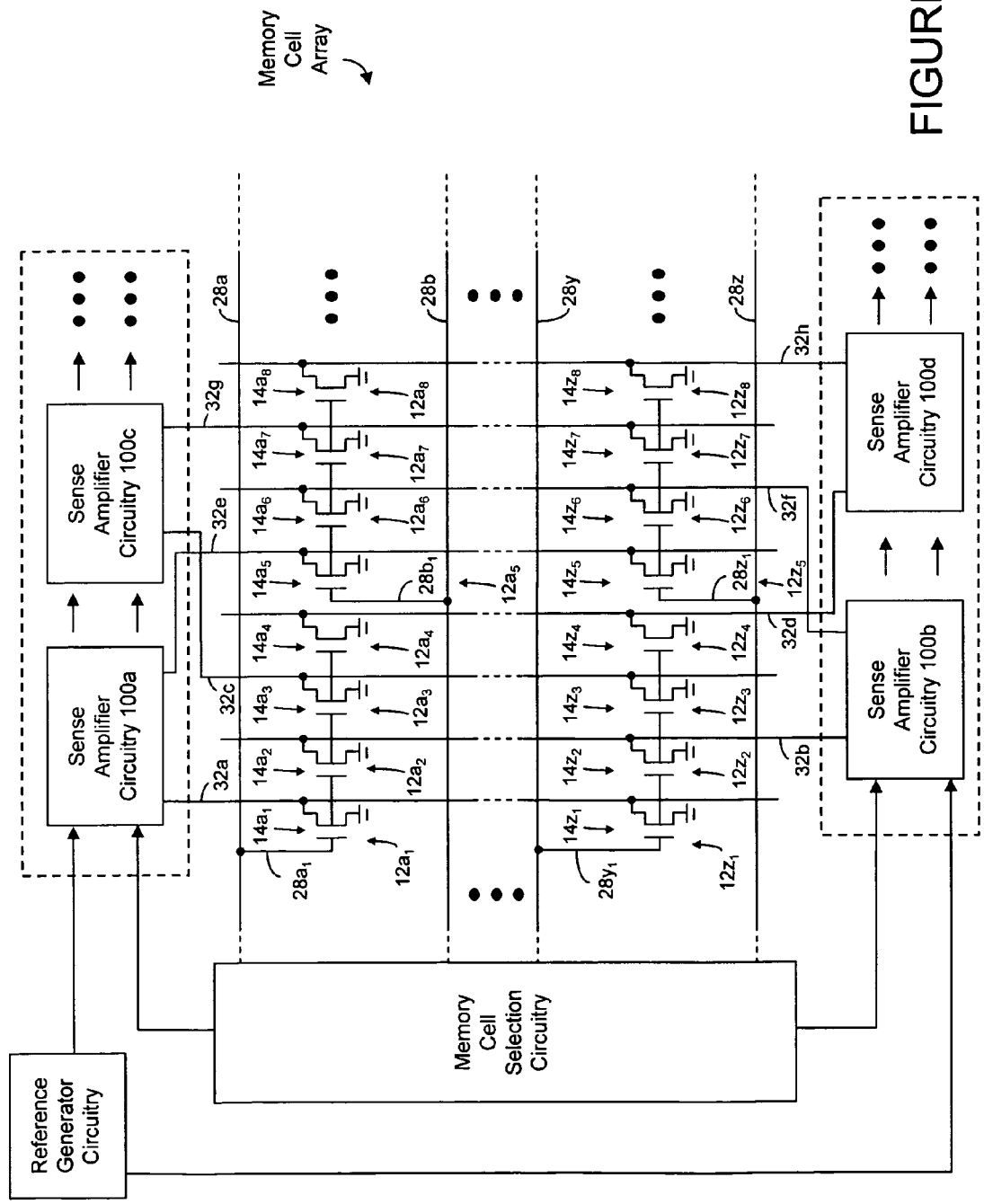

Briefly, with reference to FIGS. 16A and 16B, in one embodiment, reading and programming circuitry includes sense amplifier circuitry 100a which may be selectively coupled to bit lines 32a and 32c, and sense amplifier circuitry 100b coupled to bit lines 32b and 32d. In a read operation, one of the bit lines (i.e., the active bit line) is selectively connected to the data sense circuitry in order to sense the data state stored in a memory cell and/or write a data state into a memory cell which is associated with the selected bit line. For example, during a read operation, one of the bit lines 32a and 32c is connected to sense amplifier circuitry 100a. Similarly, one of the bit lines 32b and 32d is connected to sense amplifier circuitry 100b.

Figure 17:
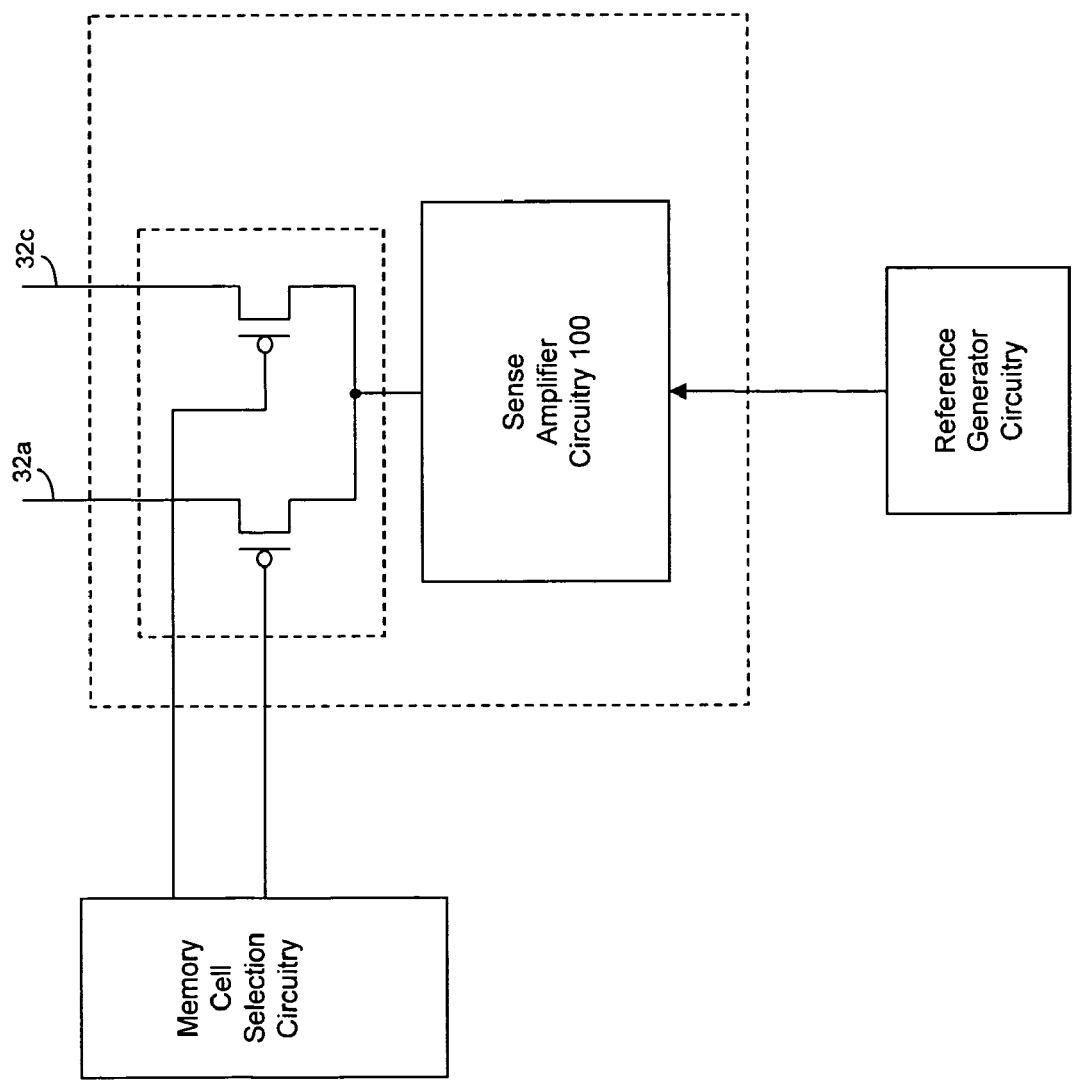
FIG. 17 is a schematic block diagram illustration of an exemplary embodiment of the bit line selection circuit, in conjunction with sense amplifier circuitry, and certain peripheral circuitry (i.e., reference generator circuitry and memory cell selection circuitry)

With reference to FIG. 17, in one embodiment, the active bit line is selected by memory cell selection circuitry using, for example, one or more bits of the row address (for example, the MSB or LSB). Notably, the other bit line is disconnected from the sense amplifier circuitry 100. Again, the architectures, circuitry and/or techniques described and illustrated in U.S. Non-Provisional patent application Ser. No. 11/787,718 are incorporated by reference herein.

In addition, the present inventions may be employed or implemented in conjunction with one or more of the memory cells, memory arrays, and techniques for programming, reading, controlling and/or operating a memory cell and array including, for example, Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530 ("Electrically Floating Body Memory Cell and Array, and Method of Operating or Controlling Same"), and (5) Okhonin et al., U.S. Patent Application Publication No. 2007/0187775 ("Multi-Bit Memory Cell Having Electrically Floating Body Transistor, and Method of Programming and Reading Same"). The entire contents of these U.S. Patent Applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

Further, the memory cells may be arranged, configured and/or controlled using any of the memory cell arrays, architectures and/or control/operation techniques. For example, the memory cells may be arranged, configured and/or controlled using any of the memory cell arrays, architectures and/or control/operation techniques described and illustrated in the following U.S. Patent Applications:

(1) Application Ser. No. 10/450,238, which was filed by Fazan et al. on Jun. 10, 2003 and entitled "Semiconductor Device" (now U.S. Pat. No. 6,969,662);

(2) Application Ser. No. 10/487,157, which was filed by Fazan et al. on Feb. 18, 2004 and entitled "Semiconductor Device" (now U.S. Pat. No. 7,061,050);

(3) Application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) Application Ser. No. 10/840,009, which was filed by Ferrant et al. on May 6, 2004 and entitled "Semiconductor Memory Device and Method of Operating Same" (U.S. Patent Application Publication No. US 2004/0228168); and (5) Application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (now U.S. Pat. No. 7,184,298).

Notably, the present inventions may be fabricated using well known techniques and/or materials. Indeed, any fabrication technique and/or material, whether now known or later developed, may be employed to fabricate the memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating body transistors, memory cells, and/or memory array(s) may employ the techniques described and illustrated in U.S. Patent Application Publication No. 2005/0017240 (now U.S. Pat. No. 7,335,934), by Fazan, ("Integrated Circuit Device, and Method of Fabricating Same") and/or U.S. Patent Application Publication No. 2007/0085140, by Bassin, ("One Transistor Memory Cell having a Strained Electrically Floating Body Region, and Method of Operating Same") (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Further, in one embodiment, an integrated circuit device includes memory section (having a plurality of memory cells, for example, PD or FD SOI memory transistors) and logic section (having, for example, high performance transistors, such as FinFET, multiple gate transistors, and/or non-high performance transistors (for example, single gate transistors that do not possess the performance characteristics of high performance transistors)). Moreover, as noted above, the memory cell and/or memory cell array, as well as the circuitry of the present inventions may be implemented in an integrated circuit device having a memory portion and a logic portion (see, for example, FIGS. 15A and 15C), or an integrated circuit device that is primarily a memory device (see, for example, FIG. 15B). The memory array may include a plurality of memory cells arranged in a plurality of rows and columns wherein each memory cell includes a transistor (whether fabricated in a bulk-type material or SOI material), for example, an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

For example, although the operation of sense amplifier circuitry 100 is described above in the context of positive AC voltages, sense amplifier circuitry 100, and the other inventions described and/or illustrated herein, are fully applicable to detecting, sensing, sampling and/or determining the data states of the memory cells in relation to negative AC voltages.

In this regard, sense amplifier circuitry 100 may be employed to detect, sense, sample and/or determine AC signals whether positive or negative or whether a voltage or current.

Further, as noted herein, although much of the circuitry is illustrated and described in the context of N-channel type transistors (for example, sense transistors 104), the circuitry may be implemented using N-channel type transistors and/or P-channel type transistors; all such implementations are intended to fall within the scope of the present inventions. For example, sense transistor(s) 104 of the embodiments of FIGS. 4, 8A and 8B may be implemented using P-channel type transistors and the current sources 102 of the embodiments illustrated in FIGS. 7A and 7B may be implemented using N-channel type transistors.

Moreover, sense amplifier circuitry 100 may include less than two stages 112. For example, with reference to FIG. 18, sense amplifier circuitry 100 includes one stage 112. The operation of exemplary sense amplifier 100 of this embodiment is similar to that described above with respect to, for example, the embodiment of FIG. 4 or 8A. For the sake of brevity, that discussion pertaining to the operation of FIG. 18 will not be repeated. Again, although sense transistor 104 is illustrated as an N-channel type transistor, a P-channel type transistor may be employed.

Figure 18:
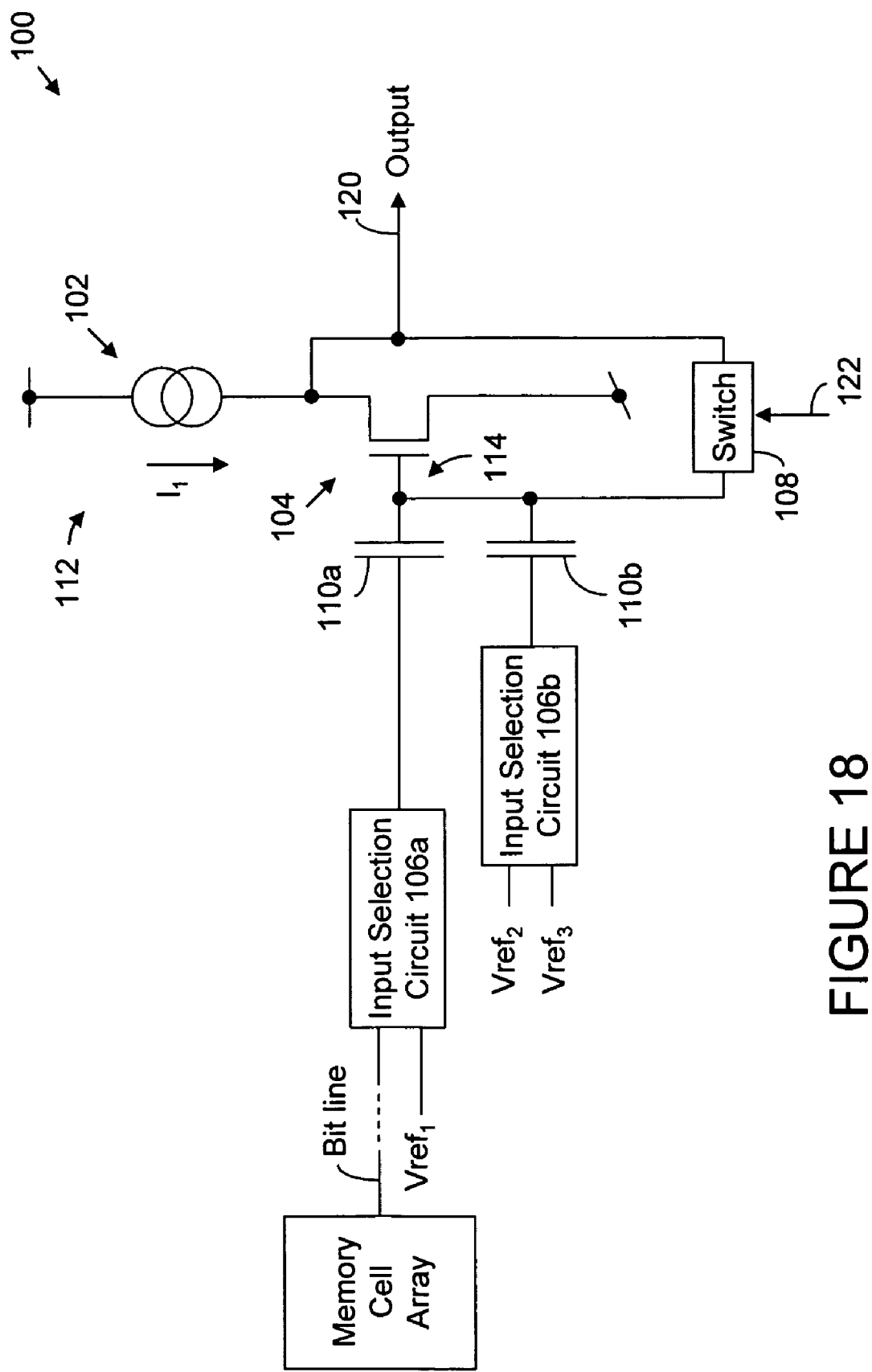
FIG. 18 is a schematic block diagram illustration of an exemplary sense amplifier circuitry, according to certain aspects and/or embodiments of the present inventions, wherein the sense amplifier circuitry of this exemplary embodiment includes less than two stages.
Figure 19A:
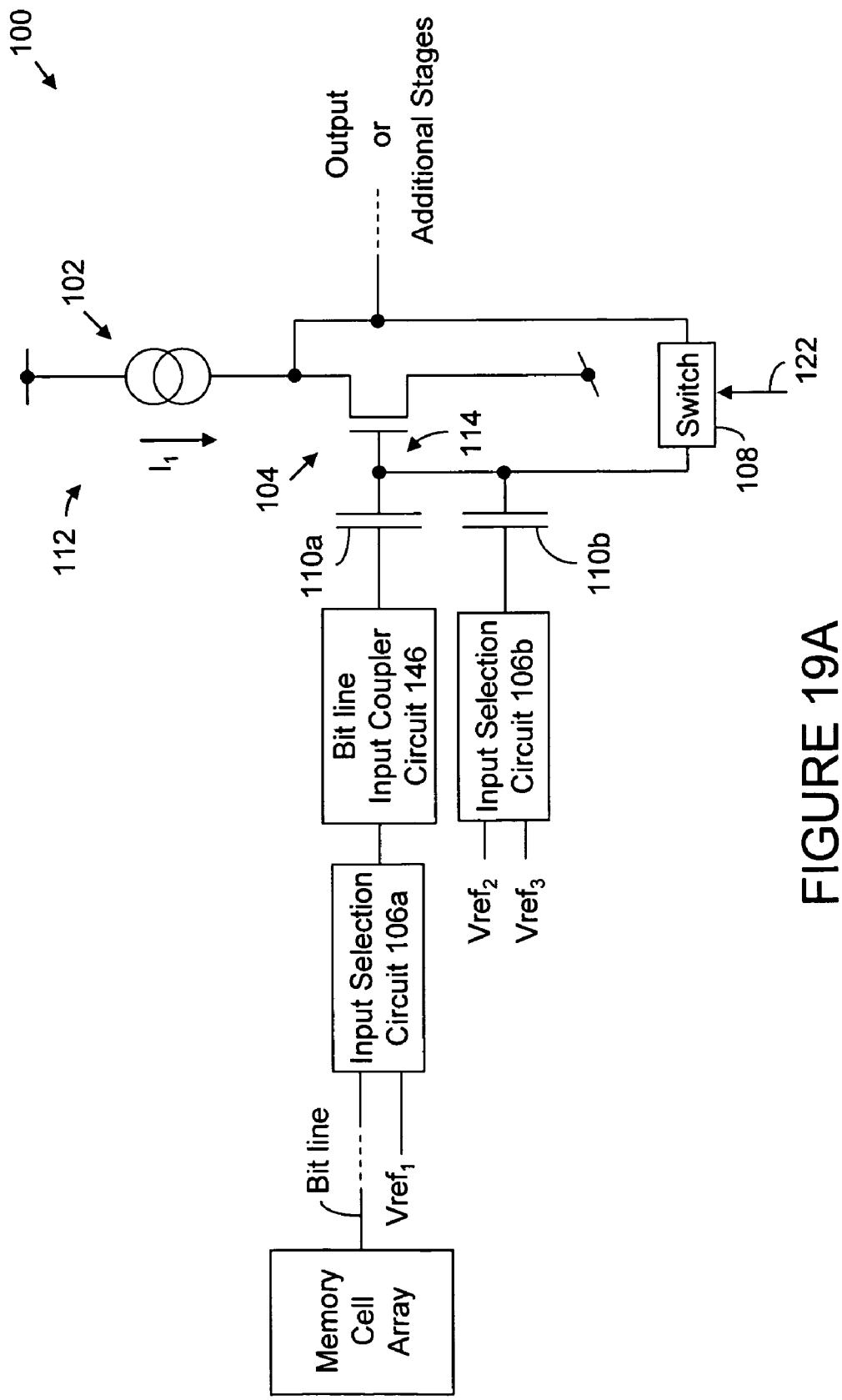
FIGS. 19A-19C are schematic block diagram illustrations of exemplary sense amplifier circuitry, according to certain aspects and/or embodiments of the inventions, wherein the sense amplifier circuitry includes a bit line input coupler circuit.
Figure 19B:
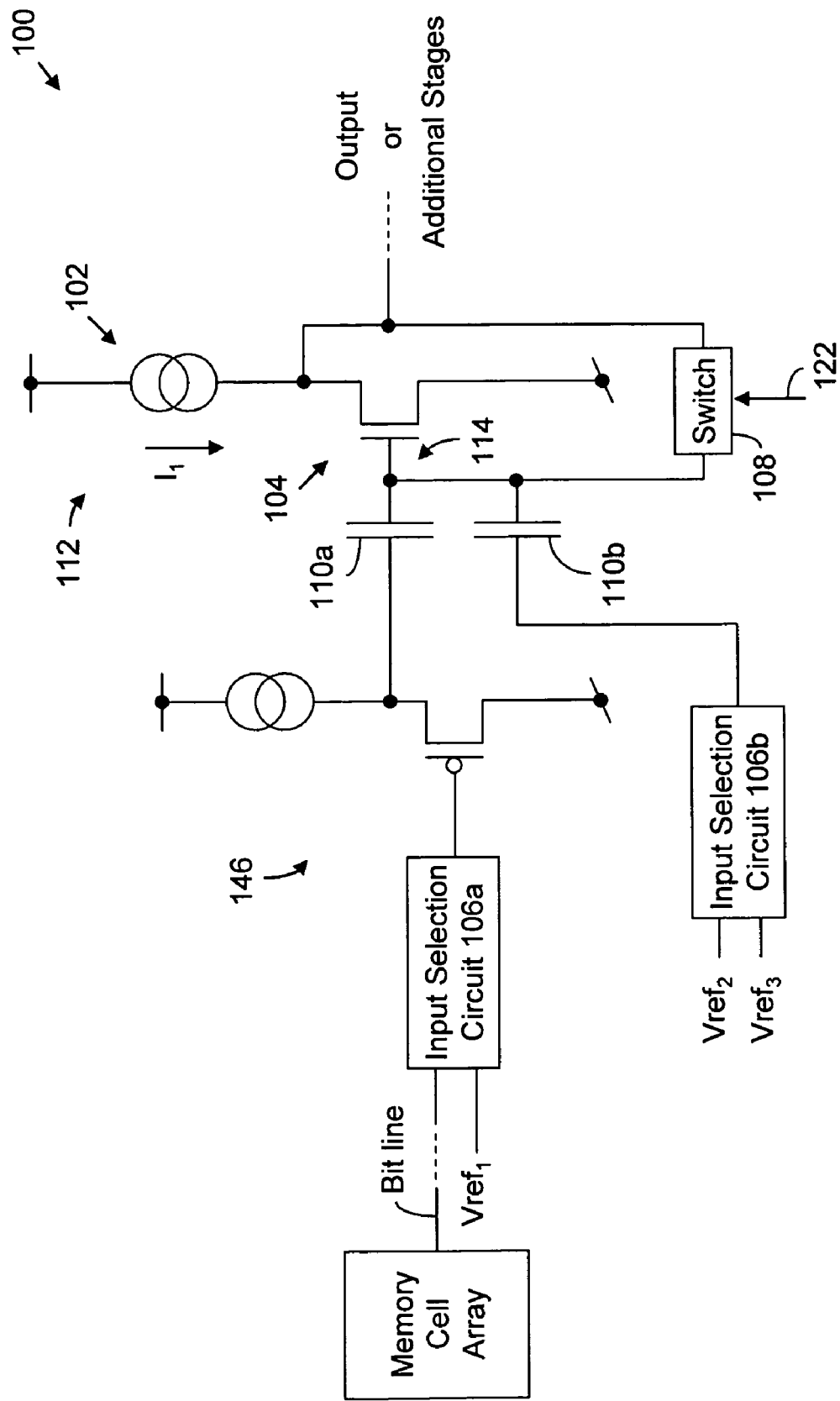
Figure 19C:
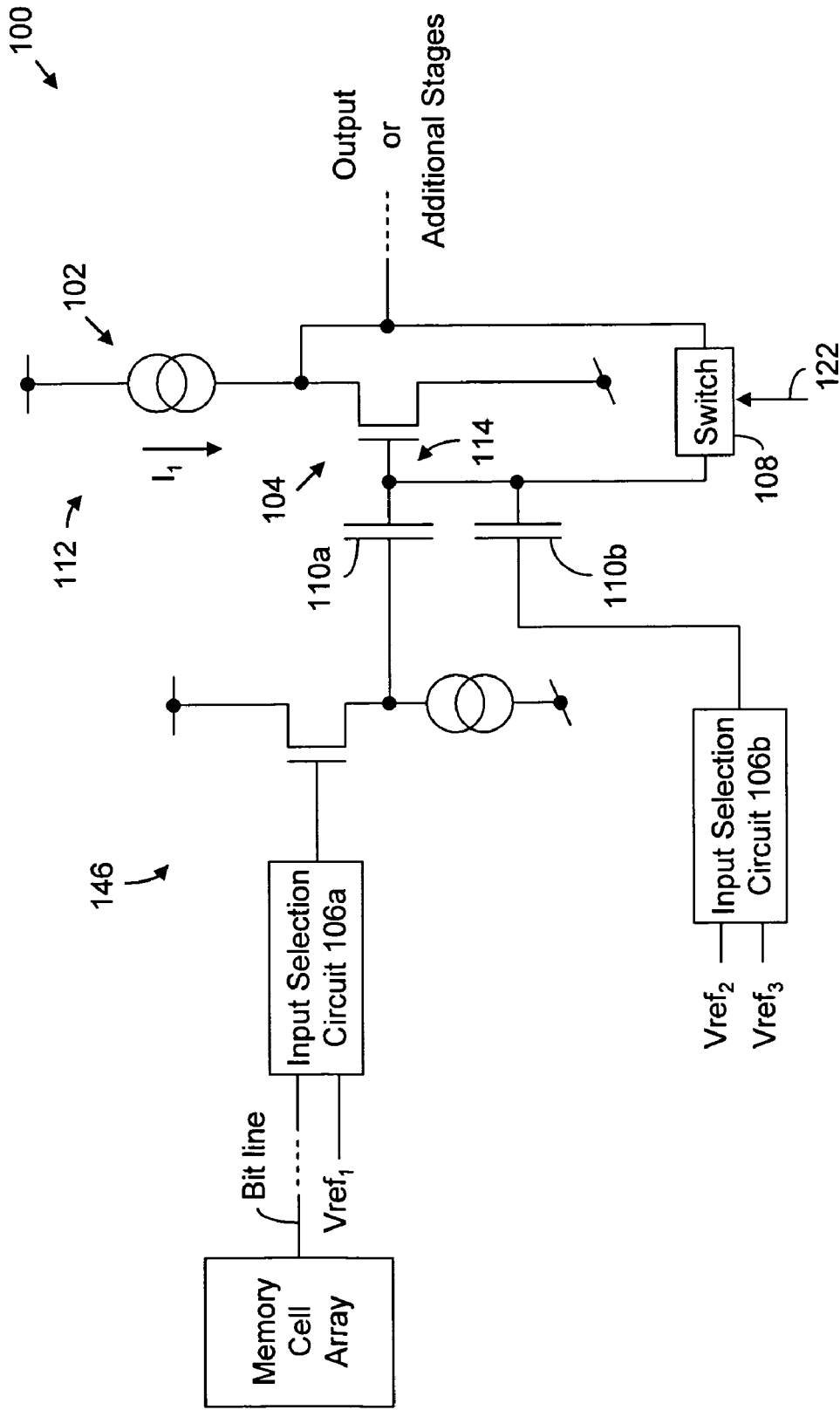

Notably, it may be advantageous to employ the embodiment of sense amplifier circuitry 100 of FIG. 18 under those circumstances where a sufficiently high gain is obtained via stage 112. For example, where the gain of stage 112 is greater than 100 or 200, the amplification of the signal on node 114 provides a relatively large voltage amplitude of the output signal on output 120 of sense amplifier circuitry 100.

Further, it may be advantageous to employ a stage 112 that includes a gain that is greater than 50, or greater than 100, or more preferably greater than 200. In this way, fewer stages 112 of sense amplifier circuitry 100 may be employed to detect, sense, sample and/or determine AC signals—whether positive or negative or whether a voltage or current; thereby reducing the spatial area or footprint of sense amplifier circuitry 100.

The embodiment of sense amplifier circuitry 100 of FIG. 18 may be implemented in conjunction with one or more circuits (for example, one or more drivers, inverters and/or latches) to, for example, more fully establish, obtain/provide a predetermined or proper polarity of, and/or maintain the data read, sensed, sampled and/or determined by sense amplifier circuitry 100 during the read operation and output on signal line 120. (See, for example, FIGS. 12-14C). Indeed, sense amplifier circuitry 100 of FIG. 18 may employ any of the clocking/control configuration of the input signals discussed herein. For example, a particular or predetermined phase of the output signal (relative to the bit line input or data state of the memory cell) may be obtained via the clocking/control configuration as discussed above. All permutations and combinations of clocking/control configurations for sense amplifier circuitry 100 are intended to fall within the scope of the present inventions.

Notably, the sense amplifier circuitry of the present inventions may include a circuit on the front-end to, for example, reduce, minimize and/or eliminate adverse affects (for example, an increase and/or change in capacitance during the sensing phase of the operation of the sense amplifier circuitry) of electrically connecting a memory cell to the sense amplifier circuitry. In this regard, a bit line input coupler circuit 146 may be disposed between input selection circuit 106a and capacitor 110a (see, for example, FIG. 19A) or between the memory cell array and input selection circuit 106. In one exemplary implementation, bit line input coupler circuit 146 may include a transistor and a current source (for example, sinking or sourcing about 10 µA) in a source follower configuration. (See, FIGS. 19B and 19C). The bit line input coupler circuit may be any circuit, whether now known or later developed, which reduce, minimize and/or eliminate adverse affects (for example, an increase and/or change in capacitance during the sensing phase of the operation of the sense amplifier circuitry) of electrically connecting a memory cell to the sense amplifier circuitry.

The bit line input coupler circuit may be implemented in conjunction with any of the embodiment of sense amplifier circuitry described and/or illustrated herein. All permutations and combinations of the bit line input coupler circuit, the sense amplifier circuitry and any other circuit/circuitry described and/or illustrated herein is intended to fall within the scope of the present inventions. For the sake of brevity, such permutations and combinations will not be described or illustrated separately herein.

Notably, the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors (whether implementing software or not). The term "data" may mean, among other things, a current or voltage signal(s) whether in an analog or a digital form. The term "to sense a/the data state stored in a/the memory cell" means, among other things, to sample, to sense, to read and/or to determine a/the data state stored in a/the memory cell; "sensing a/the data state stored in a/the memory cell", "sensed a/the data state stored in a/the memory cell" or the like shall have the same meaning.

What is claimed is:

1. An integrated circuit device comprising:
a memory cell array having a plurality of memory cells;
sense amplifier circuitry, coupled to the memory cell array, to sense a data state stored in a memory cell wherein the memory cell is one of the plurality of the memory cells in the memory cell array, the sense amplifier circuitry including:
first and second capacitors, each capacitor having first and second terminals;
a first input electrically coupled to (i) the memory cell to receive a signal which is representative of the data state stored in the memory cell and (ii) the first terminal of the first capacitor;
a second input electrically coupled to (i) a first predetermined voltage and (ii) the first terminal of the second capacitor;
a first current source having first and second terminals;
a first transistor having a gate, a first region and a second region, wherein:
the gate is electrically coupled to the second terminals of the first and second capacitors, and
the first region is electrically coupled to the first terminal of the first current source; and
wherein, during a sense phase of operation of the sense amplifier circuitry, the sense amplifier circuitry senses the data state stored in the memory cell based on the signal which is representative of the data state stored in the memory cell.

2. The integrated circuit device of claim 1 wherein the transistor is a p-channel type transistor or n-channel type transistor.

3. The integrated circuit device of claim 1 wherein a trip voltage of the sense amplifier circuitry is correlated to a ratio of the capacitances of the first and second capacitors.

4. The integrated circuit device of claim 1 wherein the sense amplifier circuitry further includes:
first selection circuit, disposed between the first input and the memory cell array, to electrically couple the memory cell to the first input during the sense phase of operation of the sense amplifier circuitry; and
second selection circuit, disposed between the second input and the first predetermined voltage, to responsively couple the first predetermined voltage to the second input during the sense phase of operation.

5. The integrated circuit device of claim 4 wherein the second selection circuit, during a precharge phase of operation of the sense amplifier circuitry, electrically couples a second predetermined voltage to the second input.

6. The integrated circuit device of claim 5 wherein a trip voltage of the sense amplifier circuitry is correlated to a ratio of the capacitances of the first and second capacitors multiplied by the amplitude of the second predetermined voltage.

7. The integrated circuit device of claim 5 wherein the first selection circuit, during the precharge phase of operation of the sense amplifier circuitry, electrically couples a third predetermined voltage to the first input.

8. The integrated circuit device of claim 1 wherein the sense amplifier circuitry further includes a feedback switch to electrically couple the gate of the first transistor to, or decouple the gate of the first transistor from the first region of the transistor wherein during the sense phase of operation, the feedback switch electrically decouples the gate of the first transistor from the first region of the first transistor.

9. The integrated circuit device of claim 8 wherein during a precharge phase of operation of the sense amplifier circuitry, the feedback switch electrically couples the gate of the first transistor from the first region of the first transistor.

10. The integrated circuit device of claim 1 wherein the sense amplifier circuitry further includes:
a second current source having first and second terminals;
a second transistor having a gate, a first region and a second region, wherein:
the gate of the second transistor is coupled to the first region of the first transistor, and
the first region of the second transistor is electrically coupled to the first terminal of the second current source; and
wherein, during a sense phase of operation of the sense amplifier circuitry, the sense amplifier circuitry outputs a signal which is representative of the data state stored in the memory cell using the signal which is representative of the data state stored in the memory cell.

11. The integrated circuit device of claim 1 wherein the sense amplifier circuitry further includes an enable transistor, coupled to the first and/or second inputs of the sense amplifier circuitry, to responsively enable the sense amplifier circuitry to, or disable the sense amplifier circuitry from sensing the data state stored in the memory cell.

12. The integrated circuit device of claim 1 wherein the enable transistor is capacitively coupled to the first and/or second inputs of the sense amplifier circuitry.

13. The integrated circuit device of claim 1 wherein the memory cell includes an electrically floating body transistor and wherein the data state of the memory cell is stored in a body region of the electrically floating body transistor.

14. The integrated circuit device of claim 13 wherein the memory cell includes an electrically floating body transistor and wherein the amplitude of the signal which is representative of the data state stored in the memory cell is responsive to the amount of current conducted by the electrically floating body transistor of the memory cell during the sense phase of operation of the sense amplifier circuitry.

15. The integrated circuit device of claim 1 wherein the sense amplifier circuitry further includes a bit line input coupler circuit, disposed between the first input and the memory cell array, to electrically and indirectly couple the memory cell to the first input during the sense phase of operation of the sense amplifier circuitry.

* * * * *